(12) United States Patent
Park et al.

(10) Patent No.: US 11,082,044 B2
(45) Date of Patent: Aug. 3, 2021

(54) INTEGRATED CIRCUIT INCLUDING POWER GATING CELL

(71) Applicant: SAMSUNG ELECTRONICS CO., LTD., Suwon-si (KR)

(72) Inventors: Chanhee Park, Incheon (KR); Jongwoo Kim, Osan-si (KR); Minsu Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/845,135

(22) Filed: Apr. 10, 2020

(65) Prior Publication Data

US 2020/0328746 A1    Oct. 15, 2020

(30) Foreign Application Priority Data

Apr. 12, 2019  (KR) .......... 10-2019-0043308
Feb. 25, 2020  (KR) .......... 10-2020-0023012

(51) Int. Cl.
| | | |
|---|---|---|
| *H03K 3/00* | (2006.01) | |
| *H03K 17/16* | (2006.01) | |
| *H03K 19/003* | (2006.01) | |
| *G11C 5/14* | (2006.01) | |
| *H03K 19/00* | (2006.01) | |
| *H03K 17/687* | (2006.01) | |

(52) U.S. Cl.
CPC ..... *H03K 19/0016* (2013.01); *H03K 17/6872* (2013.01)

(58) Field of Classification Search
None
See application file for complete search history.

(56) References Cited

U.S. PATENT DOCUMENTS

| | | | | |
|---|---|---|---|---|
| 6,049,245 A | * | 4/2000 | Son ........................ | G11C 5/147 327/544 |
| 6,977,519 B2 | * | 12/2005 | Bhavnagarwala ......... | H03K 19/0016 326/34 |
| 7,190,187 B2 | | 3/2007 | Hua et al. | |
| 7,262,631 B2 | * | 8/2007 | Chong ............... | H03K 19/0016 326/112 |
| 7,266,707 B2 | * | 9/2007 | Ngo ....................... | G06F 1/3228 257/207 |
| 7,276,932 B2 | | 10/2007 | Kuang et al. | |
| 7,589,584 B1 | * | 9/2009 | Bui .......................... | G05F 1/56 326/33 |
| 7,834,377 B2 | * | 11/2010 | Iwamatsu ........... | H01L 27/1203 257/147 |
| 8,063,414 B2 | * | 11/2011 | Uchida ............... | H01L 27/0207 257/206 |

(Continued)

*Primary Examiner* — Kenneth B Wells
(74) *Attorney, Agent, or Firm* — F. Chau & Associates, LLC

(57) ABSTRACT

An integrated circuit is provided. The integrated circuit includes a power gating circuit configured to receive a power supply voltage from a first power line and to output a first driving voltage to a first virtual power line and a logic circuit electrically connected to the first virtual power line and configured to receive power from the power gating circuit. The power gating circuit includes a first p-type transistor and a first n-type transistor connected in parallel between the first power line and the first virtual power line.

17 Claims, 19 Drawing Sheets

(56) References Cited

U.S. PATENT DOCUMENTS

| | | | |
|---|---|---|---|
| 8,456,223 B2 * | 6/2013 | Myers | H03K 19/0016 |
| | | | 327/534 |
| 8,648,392 B2 * | 2/2014 | Nishimura | H01L 27/0207 |
| | | | 257/206 |
| 8,726,216 B2 | 5/2014 | Suzuki et al. | |
| 8,922,247 B2 | 12/2014 | Myers et al. | |
| 9,312,860 B1 | 4/2016 | Paschal et al. | |
| 9,620,200 B1 | 4/2017 | Mangal et al. | |
| 10,205,440 B2 | 2/2019 | Reddy et al. | |
| 2004/0080340 A1 * | 4/2004 | Hidaka | G11C 5/147 |
| | | | 326/83 |
| 2012/0200345 A1 * | 8/2012 | Kim | H03K 19/0016 |
| | | | 327/543 |
| 2015/0249449 A1 | 9/2015 | Cai et al. | |

* cited by examiner

FIG. 4B

| Mode | PT | NT1 | NT2 | NT3 |
|---|---|---|---|---|
| Power-on(VDD) | ON | OFF | OFF | OFF |
| Retention 1(VR1) | OFF | ON | OFF | OFF |
| Retention 2(VR2) | OFF | OFF | ON | OFF |
| Retention 3(VR3) | OFF | OFF | OFF | ON |
| Power-off(floating) | Not Used | | | |

INTEGRATED CIRCUIT INCLUDING POWER GATING CELL

CROSS-REFERENCE TO RELATED APPLICATIONS

This U.S. non-provisional patent application claims the benefit of priority under 35 U.S.C. § 119 to Korean Patent Application Nos. 10-2019-0043308, filed on Apr. 12, 2019 and 10-2020-0023012, filed on Feb. 25, 2020, in the Korean Intellectual Property Office, the disclosures of which are incorporated by reference in their entirety herein.

BACKGROUND

1. Technical Field

The inventive concept relates to an integrated circuit, and more particularly, to an integrated circuit including a power gating cell.

2. Discussion of Related Art

In designing an integrated circuit, in order to reduce power consumption, a power gating circuit is used. The power gating circuit may reduce power consumption, by shutting off the current to logic circuit blocks of the circuit that are not in use. The power gating circuit may also reduce leakage current by blocking power supplied to a logic circuit block in a sleep mode. The power gating circuit may also provide a retention mode in which a retention voltage lower than an operation voltage in a power-on mode is provided in order to maintain an internal state or a register value of the logic circuit block.

SUMMARY

At least one embodiment of the inventive concept relates to an integrated circuit including a power gating circuit, a method of designing the integrated circuit, and a computing system for designing the integrated circuit.

According to an exemplary embodiment of the inventive concept, there is provided an integrated circuit, including a power gating circuit configured to receive a power supply voltage from a first power line and to output a first driving voltage to a first virtual power line and a logic circuit electrically connected to the first virtual power line and configured to receive power from the power gating circuit. The power gating circuit includes a first p-type transistor and a first n-type transistor connected in parallel between the first power line and the first virtual power line.

According to an exemplary embodiment of the inventive concept, there is provided an integrated circuit including a first power gating cell configured to receive a power supply voltage from a first power line and to provide a first driving voltage to a logic cell through a first virtual power line. The first power gating cell includes a first P-type metal-oxide-semiconductor (PMOS) area having a first p-type transistor connected between the first power line and the first virtual power line, a first N-type metal-oxide-semiconductor (NMOS) area having a first n-type transistor connected between the first power line and the first virtual power line, and a second NMOS area having a second n-type transistor connected between the first power line and the first virtual power line. The first PMOS area includes an n well doped with n-type impurities and extending in a first direction.

According to an exemplary embodiment of the inventive concept, there is provided an integrated circuit including a first power gating cell for receiving a ground voltage from a ground line and providing a driving voltage to a logic cell through a virtual ground line. The first power gating cell includes a first NMOS area having an n-type transistor connected between the ground line and the virtual ground line, a first PMOS area having a first p-type transistor connected between the ground line and the virtual ground line is formed, and a second PMOS area having a second p-type transistor connected between the ground line and the virtual ground line. The first PMOS area is formed in an n well doped with n-type impurities and extends in a first direction.

BRIEF DESCRIPTION OF THE DRAWINGS

Embodiments of the inventive concept will be more clearly understood from the following detailed description taken in conjunction with the accompanying drawings in which:

FIG. 4B is a view illustrating a voltage provided to a logic circuit in accordance with an operation of a power gating circuit according to an exemplary embodiment of the inventive concept;

DETAILED DESCRIPTION OF THE EXEMPLARY EMBODIMENTS

Figure 1:
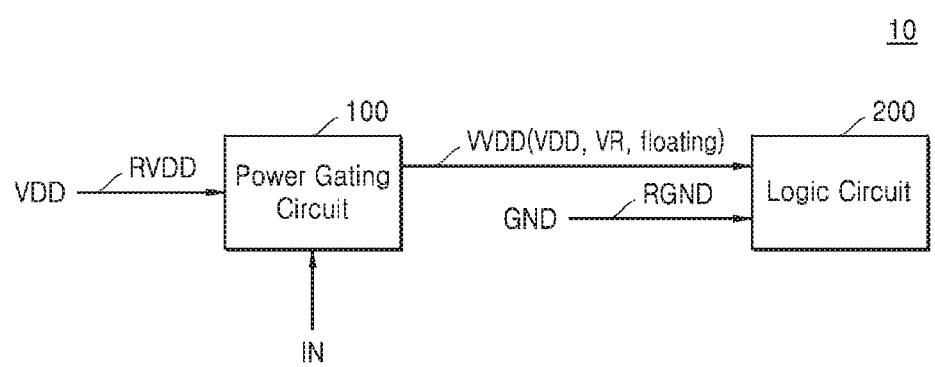
FIG. 1 is a block diagram illustrating an integrated circuit including a power gating circuit according to an exemplary embodiment of the inventive concept.

FIG. 1 is a block diagram illustrating an integrated circuit 10 including a power gating circuit 100 according to an exemplary embodiment of the inventive concept.

Referring to FIG. 1, the integrated circuit 10 includes a logic circuit 200 and the power gating circuit 100 for providing power to the logic circuit 200. The logic circuit 200 is electrically connected to the first virtual power line VVDD and the second power line RGND and receives power through the first virtual power line VVDD and the second power line RGND. According to an exemplary embodiment, the second power line RGND is a ground line and a ground voltage GND is applied to the logic circuit 200 through the second power line RGND.

According to an exemplary embodiment of the inventive concept, the integrated circuit 10 is a system-on-chip (SOC). For example, the integrated circuit 10 may be an application processor, a media processor, a microprocessor, a central processing unit (CPU), or a similar device.

The power gating circuit 100 is electrically connected to the first virtual power line VVDD that provides a power supply voltage VDD. The power gating circuit 100 may control a first driving voltage provided to the logic circuit 200 and a power mode of the logic circuit 200 by selectively connecting the first power line RVDD to the first virtual power line VVDD in response to a control signal IN.

For example, the power gating circuit 100 may provide the power supply voltage VDD to the logic circuit 200 by connecting the first power line RVDD to the first virtual power line VVDD in a power-on mode and may provide a high retention voltage VR having a level lower than that of the power supply voltage VDD to the logic circuit 200 by connecting the first power line RVDD to the first virtual power line VVDD in a retention mode. On the other hand, the power gating circuit 100 may float the first virtual power line VVDD by blocking the first power line RVDD from the first virtual power line VVDD in a power-off mode. For example, the power gating circuit 100 could disconnect the first power line RVD from the first virtual power line VVDD to float the first virtual power line VVDD.

The integrated circuit 10 may further include a power managing circuit and the control signal IN may be provided from the power managing circuit from outside of the power gating circuit 100. The power managing circuit may apply the control signal IN to the power gating circuit 100 so that a level of a voltage provided to the logic circuit 200 varies in accordance with the power mode.

The logic circuit 200 may selectively receive power through the first virtual power line VVDD. A first driving voltage having a level that varies in accordance with the power mode may be provided to the logic circuit 200. For example, the logic circuit 200 may receive the power supply voltage VDD in the power-on mode and may receive the high retention voltage VR in the retention mode and power may be blocked in the power-off mode. In FIG. 1, only one high retention voltage VR is illustrated. However, the integrated circuit 10 according to the inventive concept may include a plurality of retention modes and may provide high retention voltages having different voltage levels to the logic circuit 200.

The logic circuit 200 may include an arbitrary circuit electrically connected to the first virtual power line VVDD. For example, the logic circuit 200 may be implemented by at least one of an inverter, a NAND gate, an AND gate, a NOR gate, an OR gate, an XOR gate, an XNOR gate, a multiplexer, an adder, a latch, or a flip-flop.

Figure 2:
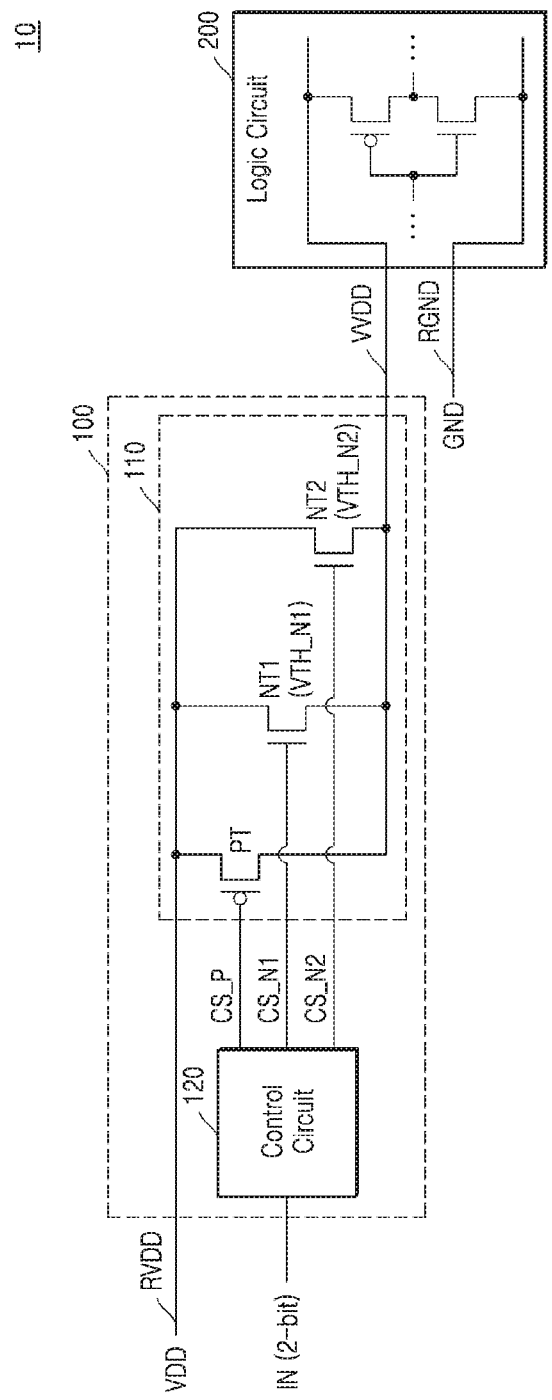
FIG. 2 is a circuit diagram illustrating an integrated circuit including a power gating circuit according to an exemplary embodiment of the inventive concept.

FIG. 2 is a circuit diagram illustrating an integrated circuit 10 including a power gating circuit 10 according to an exemplary embodiment of the inventive concept.

Referring to FIG. 2, the power gating circuit 100 includes a header transistor unit 110 connected between the first power line RVDD and the first virtual power line VVDD and a control circuit 120 for providing first to third switching signals CS_P, CS_N1, and CS_N2 to the header transistor unit 110. The control circuit 120 may generate the first to third switching signals CS_P, CS_N1, and CS_N2 in response to the control signal IN. Unlike that shown in FIG. 2, a power gating circuit 100 according to alternate embodiment does not include the control circuit 120 and the header transistor unit 110, but directly receives the first to third switching signals CS_P, CS_N1, and CS_N2 from a source located outside of the power gating circuit 100.

In an exemplary embodiment, the header transistor unit 110 includes a p-type transistor PT, a first n-type transistor NT1, and a second n-type transistor NT2 connected between the first power line RVDD and the first virtual power line VVDD in parallel. The p-type transistor PT, the first n-type transistor NT1, and the second n-type transistor NT2 of FIG. 2 may be illustrated as equivalent transistors and each of the p-type transistor PT, the first n-type transistor NT1, and the second n-type transistor NT2 may include a plurality of transistors.

The first n-type transistor NT1 has a first threshold voltage VTH_N1 and the second n-type transistor NT2 has a second threshold voltage VTH_N2. According to an exemplary embodiment, the first threshold voltage VTH_N1 is less than the second threshold voltage VTH_N2.

The control circuit 120 may selectively turn on the transistors included in the header transistor unit 110 in response to the control signal IN. According to an exemplary embodiment, the control signal IN is a 2-bit signal. The control circuit 120 may generate a first switching signal CS_P for switching the p-type transistor PT, a second switching signal CS_N1 for switching the first n-type transistor NT1, and a third switching signal CS_N2 for switching the second n-type transistor NT2 in response to the control signal IN. For example, the control circuit may apply the first switching signal CS_P to a gate terminal of the p-type transistor PT, the second switching signal CS_N1 to a gate terminal of the first n-type transistor NT1, the third switching signal CS_N2 to a gate terminal of the second n-type transistor NT2.

In accordance with operations of the p-type transistor PT, the first n-type transistor NT1, and the second n-type transistor NT2 included in the header transistor unit 110, a voltage of the first virtual power line VVDD electrically connected to the logic circuit 200 and the power mode of the logic circuit 200 may vary. According to an exemplary embodiment, the logic circuit 200 includes an inverter. Unlike that illustrated in FIG. 2, the logic circuit 200 may include a logic circuit other than the inverter.

The power gating circuit 100 according to an exemplary embodiment of the inventive concept may control a magnitude of the first driving voltage provided to the logic circuit 200 by turning on a transistor selected from the p-type transistor PT, the first n-type transistor NT1, and the second n-type transistor NT2. Description of the power mode of the logic circuit 200 and the magnitude of the voltage provided to the logic circuit 200 will be given hereinafter with reference to FIGS. 3A and 3D.

FIGS. 3A to 3D are views illustrating a voltage provided to a logic circuit 200 in accordance with an operation of the power gating circuit of FIG. 2. FIGS. 3A to 3D are views illustrating that the logic circuit 200 operates in the power-on mode, a first retention mode, a second retention mode, and the power-off mode, respectively.

Figure 3A:
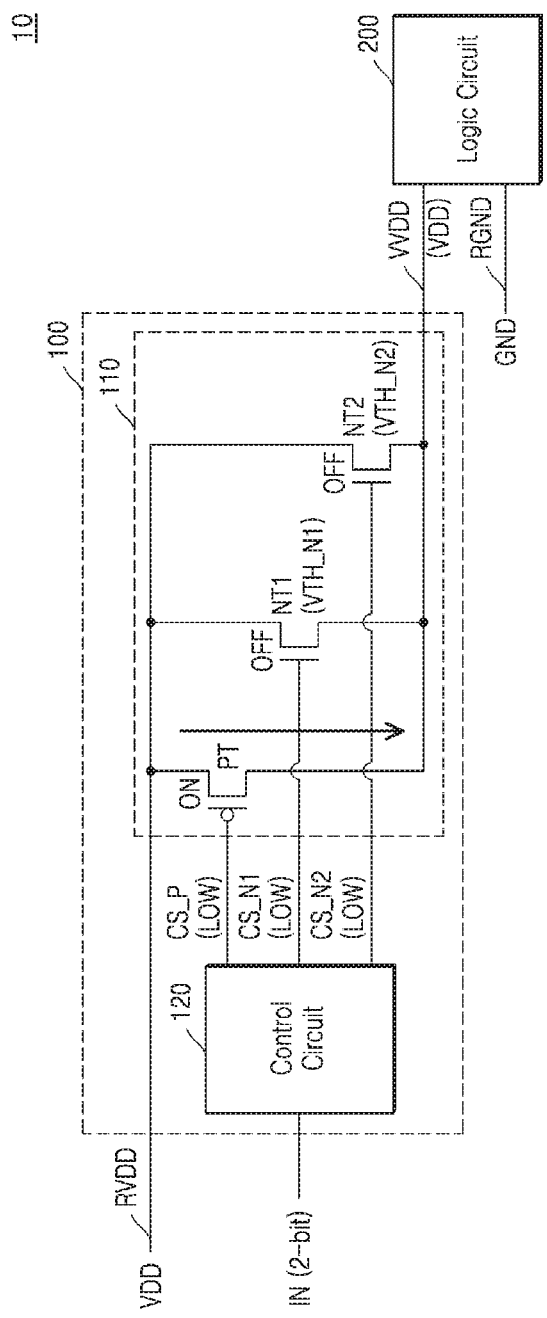
FIGS. 3A to 3D are views illustrating a voltage provided to a logic circuit in accordance with an operation of the power gating circuit of FIG. 2.

Referring to FIG. 3A, in the power-on mode, the control circuit 120 generates the first to third switching signals CS_P, CS_N1, and CS_N2 for turning on the p-type transistor PT, turning off the first n-type transistor NT1, and turning off the second n-type transistor NT2. For example, the control circuit 120 may generate the first switching signal CS_P at a logic low level, the second switching signal CS_N1 at a logic low level, and the third switching signal CS_N2 at a logic low level. Among the p-type transistor PT, the first n-type transistor NT1, and the second n-type transistor NT2, only the p-type transistor PT is turned on so that a current flows through the p-type transistor PT and a level of a voltage of the first virtual power line VVDD may be the same as that of the power supply voltage VDD of the first power line RVDD.

Figure 3B:
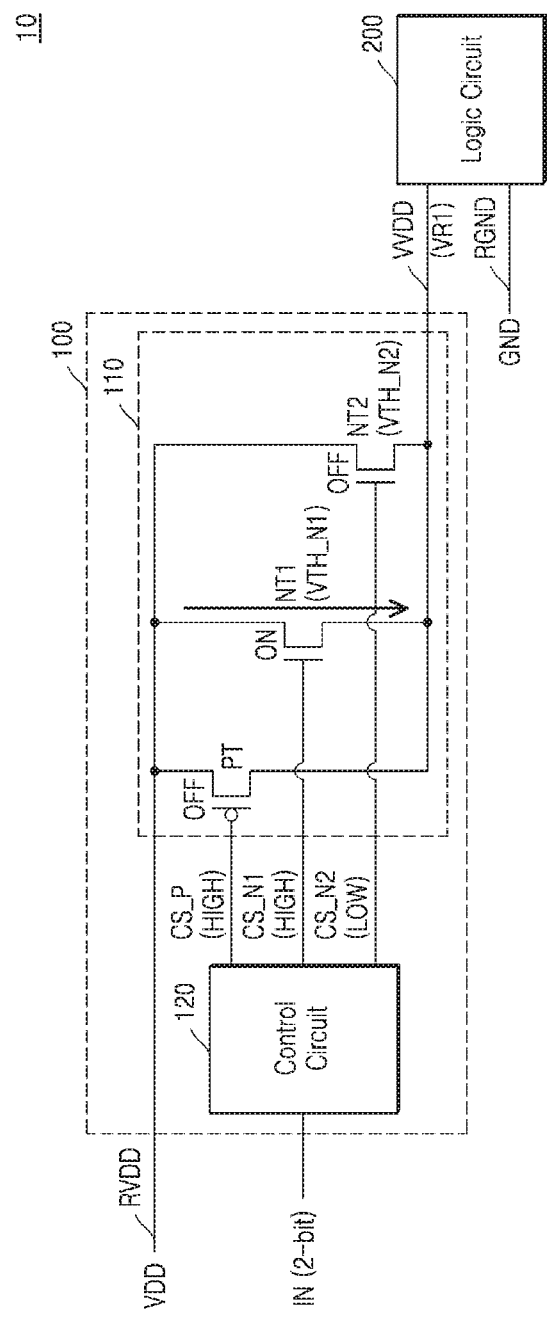

Referring to FIG. 3B, in the first retention mode, the control circuit 120 generates the first to third switching signals CS_P, CS_N1, and CS_N2 for turning on the first n-type transistor NT1, turning off the p-type transistor PT, and turning off the second n-type transistor NT2. For example, the control circuit 120 may generate the first switching signal CS_P at a logic high level, the second switching signal CS_N1 at a logic high level, and the third switching signal CS_N2 at a logic low level.

Among the p-type transistor PT, the first n-type transistor NT1, and the second n-type transistor NT2, only the first n-type transistor NT1 is turned on so that a current flows through the first n-type transistor NT1 and the level of the voltage of the first virtual power line VVDD may be the same as a level of a first high retention voltage VR1. When the first n-type transistor NT1 is turned on, due to the first threshold voltage VTH_N1 of the first n-type transistor NT1, the first virtual power line VVDD may have the first high retention voltage VR1 lower than the power supply voltage VDD of the first power line RVDD by the first threshold voltage VTH_N1.

Figure 3C:
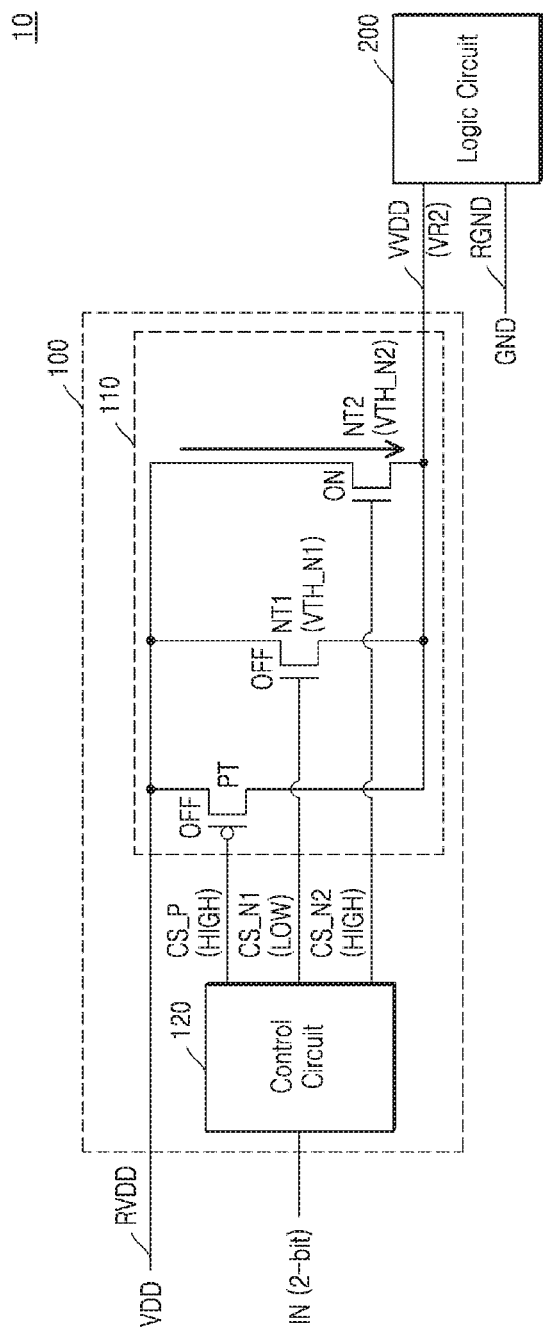

Referring to FIG. 3C, in the second retention mode, the control circuit 120 generates the first to third switching signals CS_P, CS_N1, and CS_N2 for turning on the second n-type transistor NT2, turning off the p-type transistor PT, and turning off the first n-type transistor NT1. For example, the control circuit 120 may generate the first switching signal CS_P at a logic high level, the second switching signal CS_N1 at a logic low level, and the third switching signal CS_N2 at a logic high level.

Among the p-type transistor PT, the first n-type transistor NT1, and the second n-type transistor NT2, only the second n-type transistor NT2 is turned on so that a current flows through the second n-type transistor NT2 and the level of the voltage of the first virtual power line VVDD may be the same as a level of a second high retention voltage VR2. When the second n-type transistor NT2 is turned on, due to the second threshold voltage VTH_N2 of the second n-type transistor NT2, the first virtual power line VVDD may have the second high retention voltage VR2 lower than the power supply voltage VDD of the first power line RVDD due to the second threshold voltage VTH_N2.

According to an exemplary embodiment, the second threshold voltage VTH_N2 is greater than the first threshold voltage VTH_N1. Therefore, the second high retention voltage VR2 may be at a level lower than that of the first high retention voltage VR1.

Figure 3D:
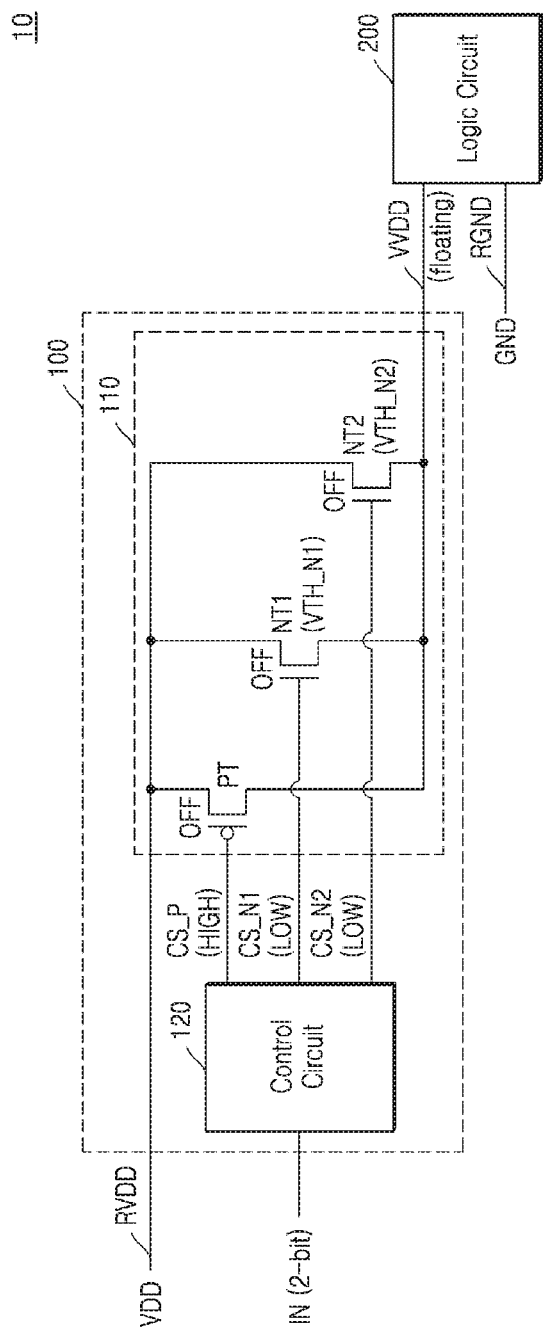

Referring to FIG. 3D, in the power-off mode, the control circuit 120 generates the first to third switching signals CS_P, CS_N1, and CS_N2 for turning off all of the p-type transistor PT, the first n-type transistor NT1, and the second n-type transistor NT2. For example, the control circuit 120 may generate the first switching signal CS_P at a logic high level, the second switching signal CS_N1 at a logic low level, and the third switching signal CS_N2 at a logic low level. Since all of the p-type transistor PT, the first n-type transistor NT1, and the second n-type transistor NT2 are turned off, the first virtual power line VVDD may be blocked from the first power line RVDD and may float.

Referring to FIGS. 3A to 3D, the power gating circuit 100 according to an exemplary embodiment of the inventive concept may control a magnitude of a voltage of the first virtual power line VVDD electrically connected to the logic circuit 200 in accordance with the power mode. Therefore, the integrated circuit 10 may operate in various retention modes (for example, the first retention mode and the second retention mode) other than the power-on mode and the power-off mode.

Figure 4A:
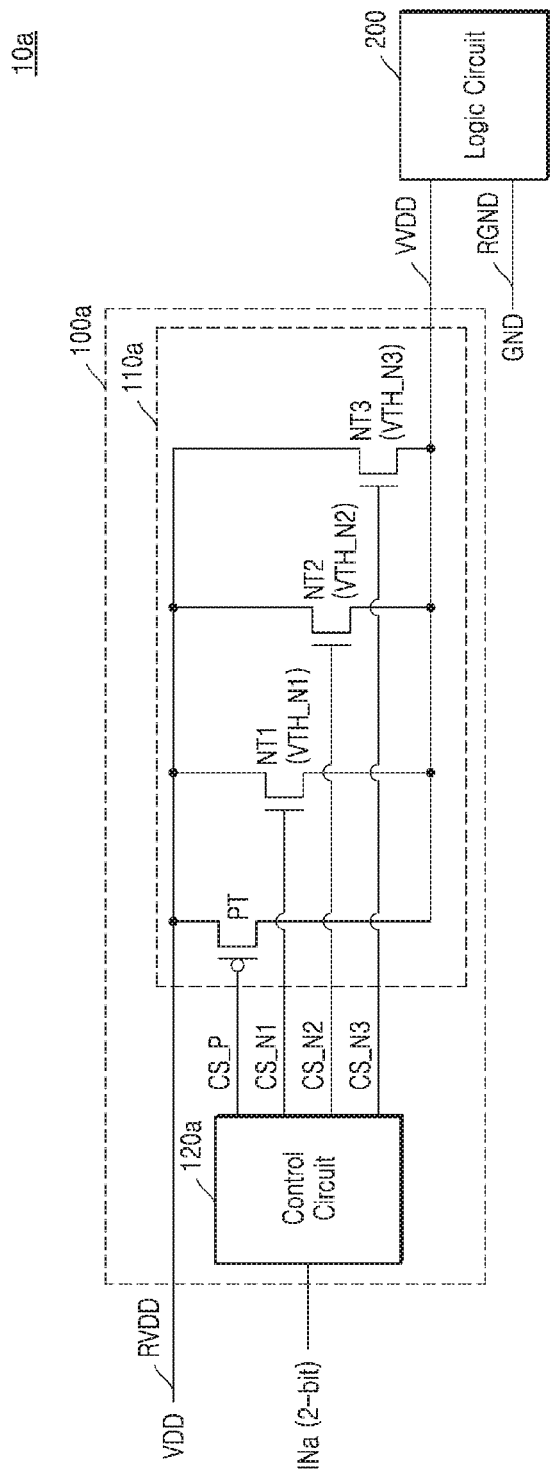
FIG. 4A is a circuit diagram illustrating an integrated circuit including a power gating circuit according to an exemplary embodiment of the inventive concept.

FIG. 4A is a circuit diagram illustrating an integrated circuit 10a including a power gating circuit 100a according to an exemplary embodiment of the inventive concept. FIG. 4B is a view illustrating a voltage provided to a logic circuit 200 in accordance with an operation of a power gating circuit 100a according to an exemplary embodiment of the inventive concept.

Referring to FIG. 4A, the integrated circuit 10a includes the logic circuit 200 and the power gating circuit 100a for providing power to the logic circuit 200. The power gating circuit 100a may control the power mode of the logic circuit 200 in response to a control signal INa and may provide a voltage of one of various magnitudes to the logic circuit 200.

The logic circuit 200 may be electrically connected to the first virtual power line VVDD and the second power line RGND and may receive power through the first virtual power line VVDD and the second power line RGND. According to an exemplary embodiment, the second power line RGND is a ground line.

The power gating circuit 100a includes a header transistor unit 110a connected between the first power line RVDD and the first virtual power line VVDD and a control circuit 120a for providing first to fourth switching signals CS_P, CS_N1, CS_N2, and CS_N3 to the header transistor unit 110a. The control circuit 120a may generate the first to fourth switching signals CS_P, CS_N1, CS_N2, and CS_N3 in response to the control signal INa.

The header transistor unit 110a includes a p-type transistor PT, a first n-type transistor NT1, a second n-type transistor NT2, and a third n-type transistor NT3 connected between the first power line RVDD and the first virtual power line VVDD in parallel. According to an exemplary embodiment, the third n-type transistor NT3 may include a plurality of transistors. In FIG. 4A, the third n-type transistor NT3 may be illustrated as an equivalent transistor.

The third n-type transistor NT3 has a third threshold voltage VTH_N3. According to an exemplary embodiment, the first threshold voltage VTH_N1 is less than the second threshold voltage VTH_N2 and the second threshold voltage VTH_N2 is less than the third threshold voltage VTH_N3.

The control circuit 120a may selectively turn on the transistors included in the header transistor unit 110a in response to the control signal INa. According to an exemplary embodiment, the control signal INa is a 2-bit signal. The control circuit 120a may generate the first switching signal CS_P for switching the p-type transistor PT, the second switching signal CS_N1 for switching the first n-type transistor NT1, the third switching signal CS_N2 for switching the second n-type transistor NT2, and the fourth switching signal CS_N3 for switching the third n-type transistor NT3 in response to the control signal INa. An example in which the control signal INa is the 2-bit signal is only an embodiment. The integrated circuit 10a according to the inventive concept is not limited thereto and the control signal INa may vary.

Referring to FIGS. 4A and 4B, in accordance with operations of the p-type transistor PT, the first n-type transistor NT1, the second n-type transistor NT2, and the third n-type transistor NT3 included in the header transistor unit 110a, the voltage of the first virtual power line VVDD electrically connected to the logic circuit 200 and the power mode of the logic circuit 200 may vary.

For example, in the power-on mode, only the p-type transistor PT is turned on and the first n-type transistor NT1, the second n-type transistor NT2, and the third n-type transistor NT3 are turned off. Therefore, the power supply voltage VDD may be applied to the first virtual power line VVDD.

In the first retention mode, only the first n-type transistor NT1 is turned on and the p-type transistor PT, the second n-type transistor NT2, and the third n-type transistor NT3 are turned off. Therefore, the first high retention voltage VR1 may be applied to the first virtual power line VVDD. In an exemplary embodiment, the first high retention voltage VR1 is less than the power supply voltage VDD by the first threshold voltage VTH_N1.

In the second retention mode, only the second n-type transistor NT2 is turned on and the p-type transistor PT, the first n-type transistor NT1, and the third n-type transistor NT3 are turned off. Therefore, the second high retention voltage VR2 may be applied to the first virtual power line VVDD. In an exemplary embodiment, the second high retention voltage VR2 is less than the power supply voltage VDD by the second threshold voltage VTH_N2.

In the third retention mode, only the third n-type transistor NT3 is turned on and the p-type transistor PT, the first n-type transistor NT1, and the second n-type transistor NT2 are turned off. Therefore, the third high retention voltage VR3 may be applied to the first virtual power line VVDD. In an exemplary embodiment, the third high retention voltage VR3 is less than the power supply voltage VDD by the third threshold voltage VTH_N3. According to an exemplary embodiment, the first high retention voltage VR1 is greater than the second high retention voltage VR2 and the second high retention voltage VR2 is greater than the third high retention voltage VR3.

According to an exemplary embodiment, the logic circuit 200 does not operate in the power-off mode. For example, when the logic circuit 200 is a main processor, the logic circuit 200 does not operate in the power-off mode. When the control signal INa is the 2-bit signal, the power gating circuit 100a may electrically connect the first power line RVDD to the first virtual power line VVDD without floating the first virtual power line VVDD. That is, the power gating circuit 100a may turn on at least one of the p-type transistor PT and the first to third n-type transistors NT1 to NT3.

Figure 5:
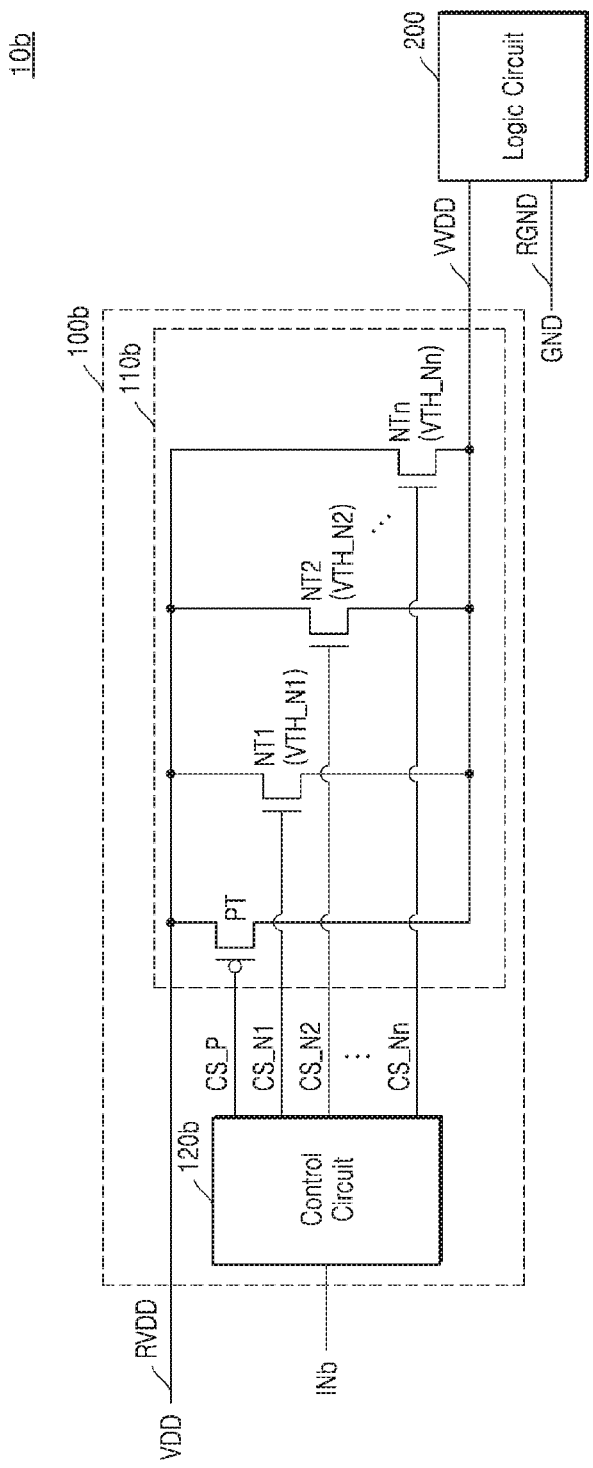
FIG. 5 is a circuit diagram illustrating an integrated circuit including a power gating circuit according to an exemplary embodiment of the inventive concept.

FIG. 5 is a circuit diagram illustrating an integrated circuit 10b including a power gating circuit 100b according to an exemplary embodiment of the inventive concept.

Referring to FIG. 5, the integrated circuit 10b includes the logic circuit 200 and the power gating circuit 100b for providing power to the logic circuit 200. The power gating circuit 100b may control the power mode of the logic circuit 200 in response to a control signal INb and may provide a first driving voltage of one of various magnitudes to the logic circuit 200.

The power gating circuit 100b includes a header transistor unit 110b connected between the first power line RVDD and the first virtual power line VVDD and a control circuit 120b for providing first to (n+1)th switching signals CS_P and CS_N1 to CS_Nn to the header transistor unit 110b. The control circuit 120b may generate the first to (n+1)th switching signals CS_P and CS_N1 to CS_Nn in response to the control signal INb.

The header transistor unit 110b includes a p-type transistor PT and first to nth n-type transistors NT1 to NTn connected between the first power line RVDD and the first virtual power line VVDD in parallel. According to an exemplary embodiment, each of the p-type transistor PT and the first to nth n-type transistors NT1 to NTn may include a plurality of transistors. In FIG. 5, the p-type transistor PT and the first to nth n-type transistors NT1 to NTn may be illustrated as equivalent transistors. As illustrated in FIG. 5, n may be a natural number of no less than 3.

In an exemplary embodiment, the first to nth n-type transistors NT1 to NTn have different threshold voltage values. The nth n-type transistor NTn has an nth threshold voltage VTH_Nn. According to an exemplary embodiment, the first threshold voltage VTH_N1 is less than the second threshold voltage VTH_N2 and the second threshold voltage VTH_N2 is less than the nth threshold voltage VTH_Nn.

The control circuit 120b may selectively turn on the transistors included in the header transistor unit 110b in response to a control signal INb. According to an exemplary embodiment, the control signal INb is a no less than 3-bit signal. The control circuit 120b generates a first switching signal CS_P for switching the p-type transistor PT, a second switching signal CS_N1 for switching the first n-type transistor NT1, a third switching signal CS_N2 for switching the second n-type transistor NT2, and an (n+1)th switching signal CS_Nn for switching the nth n-type transistor NTn in response to the control signal INb.

In accordance with operations of the p-type transistor PT and the first to nth n-type transistors NT1 to NTn included in the header transistor unit 110b, the voltage of the first virtual power line VVDD electrically connected to the logic circuit 200 and the power mode of the logic circuit 200 may vary. For example, in the power-on mode, only the p-type transistor PT is turned on and the first to nth n-type transistors NT1 to NTn are turned off. Therefore, the power supply voltage VDD may be applied to the first virtual power line VVDD.

In an nth retention mode, only the nth n-type transistor NTn is turned on and the p-type transistor PT and the first to (n−1)-type transistors NT1 to NTn−1 are turned off. Therefore, an nth high retention voltage may be applied to the first virtual power line VVDD. In an exemplary embodiment, the nth high retention voltage is less than the power supply voltage VDD by the nth threshold voltage VTH_Nn.

According to an exemplary embodiment, the first high retention voltage VR1 (FIG. 3B) and the second high retention voltage VR2 (FIG. 3B) are greater than the nth high retention voltage VRn.

The power gating circuit 100b of the integrated circuit 10b according to the inventive concept may be implemented to include n-type transistors having various numbers of different threshold voltages and the logic circuit 200 may operate in various numbers of retention modes. That is, the magnitude of the voltage of the first virtual power line VVDD electrically connected to the logic circuit 200 may vary.

Figure 6:
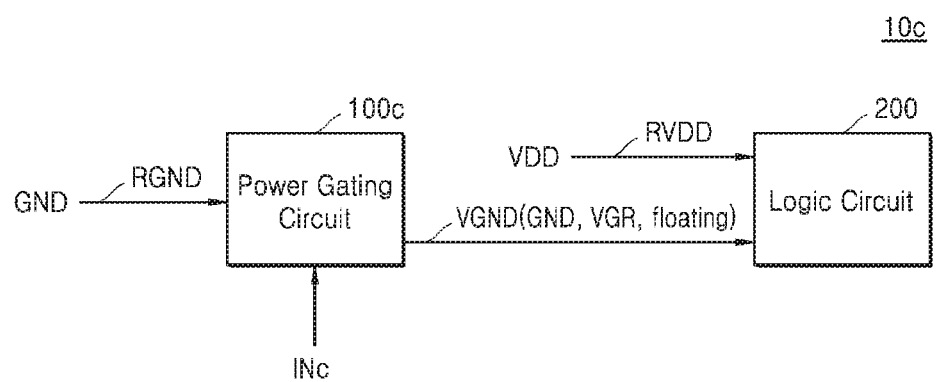
FIG. 6 is a block diagram illustrating an integrated circuit including a power gating circuit according to an exemplary embodiment of the inventive concept.

FIG. 6 is a block diagram illustrating an integrated circuit 10c including a power gating circuit 100c according to an exemplary embodiment of the inventive concept.

Referring to FIG. 6, the integrated circuit 10c includes the logic circuit 200 and the power gating circuit 100c for providing power to the logic circuit 200. The logic circuit 200 may be electrically connected to the first power line RVDD and a second virtual power line VGND and may receive power through the first power line RVDD and the second virtual power line VGND. For example, the power supply voltage VDD may be applied to the logic circuit 200 through the first power line RVDD.

The power gating circuit 100c may be electrically connected to the second power line RGND for providing the ground voltage GND. The power gating circuit 100c may control the power mode of the logic circuit 200 by selectively connecting the second virtual power line VGND to the second power line RGND in response to a control signal INc. For example, the power gating circuit 100c may provide a second driving voltage of the ground voltage GND to the logic circuit 200 by connecting the second power line RGND to the second virtual power line VGND in the power-on mode and may provide a low retention voltage VGR having a level higher than that of the ground voltage GND to the logic circuit 200 as the second driving voltage by connecting the second power line RGND to the second virtual power line VGND in the retention mode. On the other hand, the power gating circuit 100c may float the second virtual power line VGND by blocking the second power line RGND from the second virtual power line VGND in the power-off mode. For example, the power gating circuit 100c could disconnect the second virtual power line VGND from the second virtual power line VGND to float the second virtual power line VGND.

The logic circuit 200 may selectively receive power through the second virtual power line VGND. At this time, driving power having a level that varies in accordance with a power mode may be provided to the logic circuit 200. For example, the logic circuit 200 may receive the ground voltage GND in the power-on mode and may receive the low retention voltage VGR in the retention mode and power may be blocked in the power-off mode. In FIG. 6, only one low retention voltage VGR is illustrated. However, the integrated circuit 10c according to the inventive concept may include a plurality of retention modes and may provide low retention voltages at different levels to the logic circuit 200.

Figure 7:
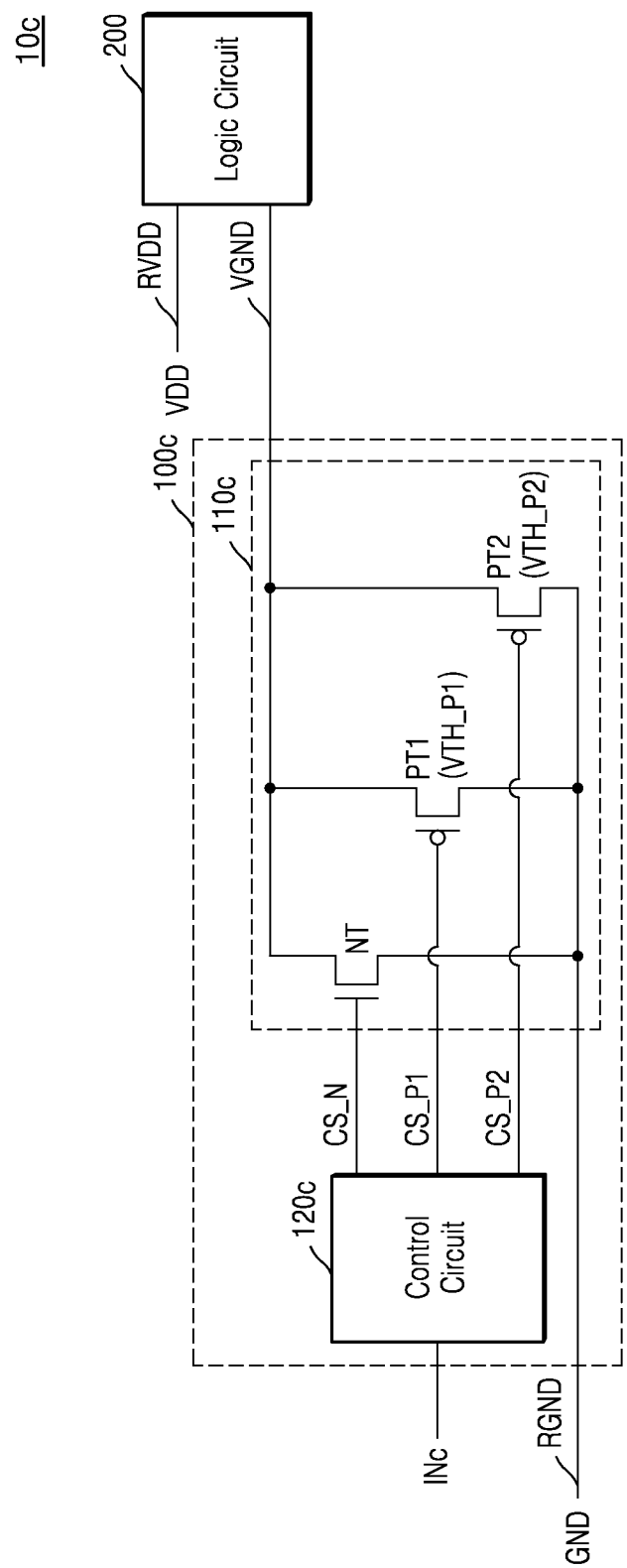
FIG. 7 is a circuit diagram illustrating an integrated circuit including a power gating circuit according to an exemplary embodiment of the inventive concept.

FIG. 7 is a circuit diagram illustrating an integrated circuit 10c including a power gating circuit 100c according to an exemplary embodiment of the inventive concept.

Referring to FIG. 7, the power gating circuit 100c includes a footer transistor unit 110c connected between the second power line RGND and the second virtual power line VGND and a control circuit 120c for providing first to third switching signals CS_N, CS_P1, and CS_P2 to the footer transistor unit 110c. The control circuit 120c may generate the first to third switching signals CS_N, CS_P1, and CS_P2 in response to the control signal INc. Unlike that illustrated in FIG. 7, in an alternate embodiment, the power gating circuit 100c does not include the control circuit 120c and the footer transistor unit 110c, but receives the first to third switching signals CS_N, CS_P1, and CS_P2 from a source located outside of the power gating circuit 100c.

The footer transistor unit 110c includes an n-type transistor NT, a first p-type transistor PT1, and a second p-type transistor PT2 connected between the second power line RGND and the second virtual power line VGND in parallel. In FIG. 7, the n-type transistor NT, the first p-type transistor PT1, and the second p-type transistor PT2 may be illustrated as equivalent transistors.

The first p-type transistor PT1 has a first threshold voltage VTH_P1 and the second p-type transistor PT2 has a second threshold voltage VTH_P2. According to an exemplary embodiment, the first threshold voltage VTH_P1 and the second threshold voltage VTH_P2 are different from each other.

The control circuit 120c may selectively turn on the transistors included in the footer transistor unit 110c in response to the control signal INc. The control circuit 120c may generate the first switching signal CS_N for switching the n-type transistor NT, the second switching signal CS_P1 for switching the first p-type transistor PT1, and the third switching signal CS_P2 for switching the second p-type transistor PT2. For example, the control circuit 120c may apply the first switching signal CS_N to a gate terminal of the n-type transistor NT, the second switching signal CS_P1 to a gate terminal of the first p-type transistor PT1, and the third switching signal CS_P2 to a gate terminal of the second p-type transistor PT2.

In accordance with operations of the n-type transistor NT, the first p-type transistor PT1, and the second p-type transistor PT2 included in the footer transistor unit 110c, the second driving voltage of the second virtual power line VGND electrically connected to the logic circuit 200 and the power mode of the logic circuit 200 may vary. For example, the logic circuit 200 may operate in one of the power-on mode, the first retention mode, the second retention mode, and the power-off mode.

In the power-on mode, the control circuit 120c generates the first to third switching signals CS_N, CS_P1, and CS_P2 for turning on the n-type transistor NT, turning off the first p-type transistor PT1, and turning off the second p-type transistor PT2. For example, the control circuit 120c may generate the first switching signal CS_N at a logic high level, the second switching signal CS_P1 at a logic high level, and the third switching signal CS_P2 at a logic high level. Among the n-type transistor NT, the first p-type transistor PT1, and the second p-type transistor PT2, only the n-type transistor NT is turned on so that a current flows through the n-type transistor NT and the second driving voltage of the second virtual power line VGND may be the same as the ground voltage GND of the second power line RGND.

In the first retention mode, the control circuit 120c may generate the first to third switching signals CS_N, CS_P1, and CS_P2 for turning on the first p-type transistor PT1. For example, the control circuit 120c may generate the first switching signal CS_N at a logic low level, the second switching signal CS_P1 at a logic low level, and the third switching signal CS_P2 at a logic high level. Among the n-type transistor NT, the first p-type transistor PT1, and the second p-type transistor PT2, only the first p-type transistor PT1 is turned on so that a current may flow through the first p-type transistor PT1. Due to the first threshold voltage VTH_P1 of the first p-type transistor PT1, the second virtual power line VGND may have a first low retention voltage greater than the ground voltage GND by a magnitude of the first threshold voltage VTH_P1.

In the second retention mode, the control circuit 120c generates the first to third switching signals CS_N, CS_P1, and CS_P2 for turning on the second p-type transistor PT2, for turning off the n-type transistor NT, and for turning off the first p-types transistor PT1. For example, the control circuit 120c may generate the first switching signal CS_N at a logic low level, the second switching signal CS_P1 at a logic high level, and the third switching signal CS_P2 at a logic low level. Among the n-type transistor NT, the first p-type transistor PT1, and the second p-type transistor PT2, only the second p-type transistor PT2 is turned on so that a current may flow through the second p-type transistor PT2. Due to the second threshold voltage VTH_P2 of the second p-type transistor PT2, the second virtual power line VGND may have a second low retention voltage greater than the ground voltage GND by a magnitude of the second threshold voltage VTH_P2. According to an exemplary embodiment, the second threshold voltage VTH_P2 has a value different from that of the first threshold voltage VTH_P1.

In the power-off mode, the control circuit 120c generates the first to third switching signals CS_N, CS_P_1, and CS_P2 for turning off the n-type transistor NT, the first p-type transistor PT1, and the second p-type transistor PT2. For example, the control circuit 120c may generate the first switching signal CS_N at a logic low level, the second switching signal CS_P1 at a logic high level, and the third switching signal CS_P2 at a logic high level. By turning off all of the n-type transistor NT, the first p-type transistor PT1, and the second p-type transistor PT2, the second virtual power line VGND may be blocked from the second power line RGND and may float.

In FIG. 7, it is illustrated that the footer transistor unit 110c includes only the first p-type transistor PT1 and the second p-type transistor PT2 that are two transistors having different threshold voltages. However, the power gating circuit 100c according to the inventive concept may include various numbers of p-type transistors having different threshold voltages. Therefore, various retention modes may be provided to the logic circuit 200. According to an exemplary embodiment, the power gating circuit 100c does not operate in the power-off mode. For example, the control circuit 120c may be designed to not turn off all of the n-type transistor NT, the first p-type transistor PT1, and the second p-type transistor PT2.

In an exemplary embodiment, power gating circuit 100, power gating circuit 100a, or power gating circuit 100b is added to the FIG. 7 so that the added power gating circuit is connected to the first virtual power line VVDD.

Figure 8:
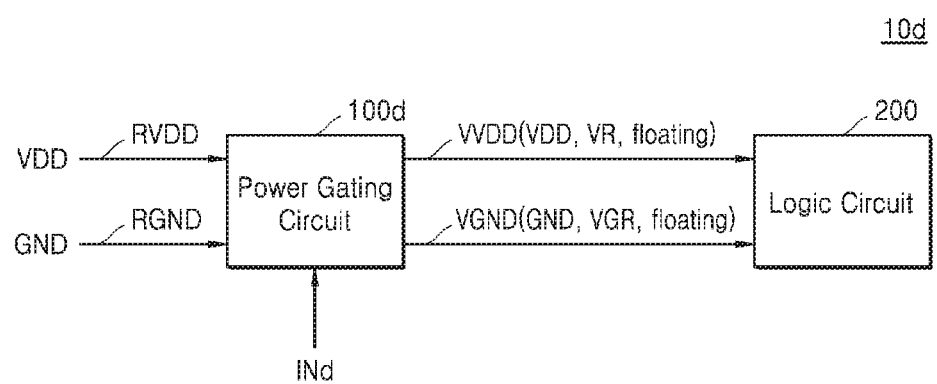
FIG. 8 is a block diagram illustrating an integrated circuit including a power gating circuit according to an exemplary embodiment of the inventive concept.

FIG. 8 is a block diagram illustrating an integrated circuit 10d including a power gating circuit 100d according to an exemplary embodiment of the inventive concept.

Referring to FIG. 8, the integrated circuit 10d includes the logic circuit 200 and the power gating circuit 100d for providing power to the logic circuit 200. The logic circuit 200 may be electrically connected to the first virtual power line VVDD and the second virtual power line VGND and may receive power through the first virtual power line VVDD and the second virtual power line VGND.

The power gating circuit 100d may be electrically connected to the first power line RVDD for providing the power supply voltage VDD and the second power line RGND for providing the ground voltage GND. The power gating circuit 100d may control the power mode of the logic circuit 200 by selectively connecting the first virtual power line VVDD to the first power line RVDD and by selectively connecting the second virtual power line VGND to the second power line RGND in response to a control signal INd.

For example, the power gating circuit 100d may provide the power supply voltage VDD and the ground voltage GND to the logic circuit 200 by connecting the first power line RVDD to the first virtual power line VVDD and by connecting the second power line RGND to the second virtual power line VGND in the power-on mode. In an exemplary embodiment, the power gating circuit 100d does not provide the high retention voltage VR to the first virtual power line VVDD, but provides the low retention voltage VGR to the second virtual power line VGND in the retention mode. In an exemplary embodiment, the power gating circuit 100d floats the first virtual power line VVDD and the second virtual power line VGND by blocking the first power line RVDD from the first virtual power line VVDD and by blocking the second power line RGND from the second virtual power line VGND in the power-off mode. In FIG. 8, one high retention voltage VR and one low retention voltage VGR are illustrated. However, the integrated circuit 10d according to the inventive concept may provide high retention voltages and low retention voltages at different levels to the logic circuit 200.

Figure 9:
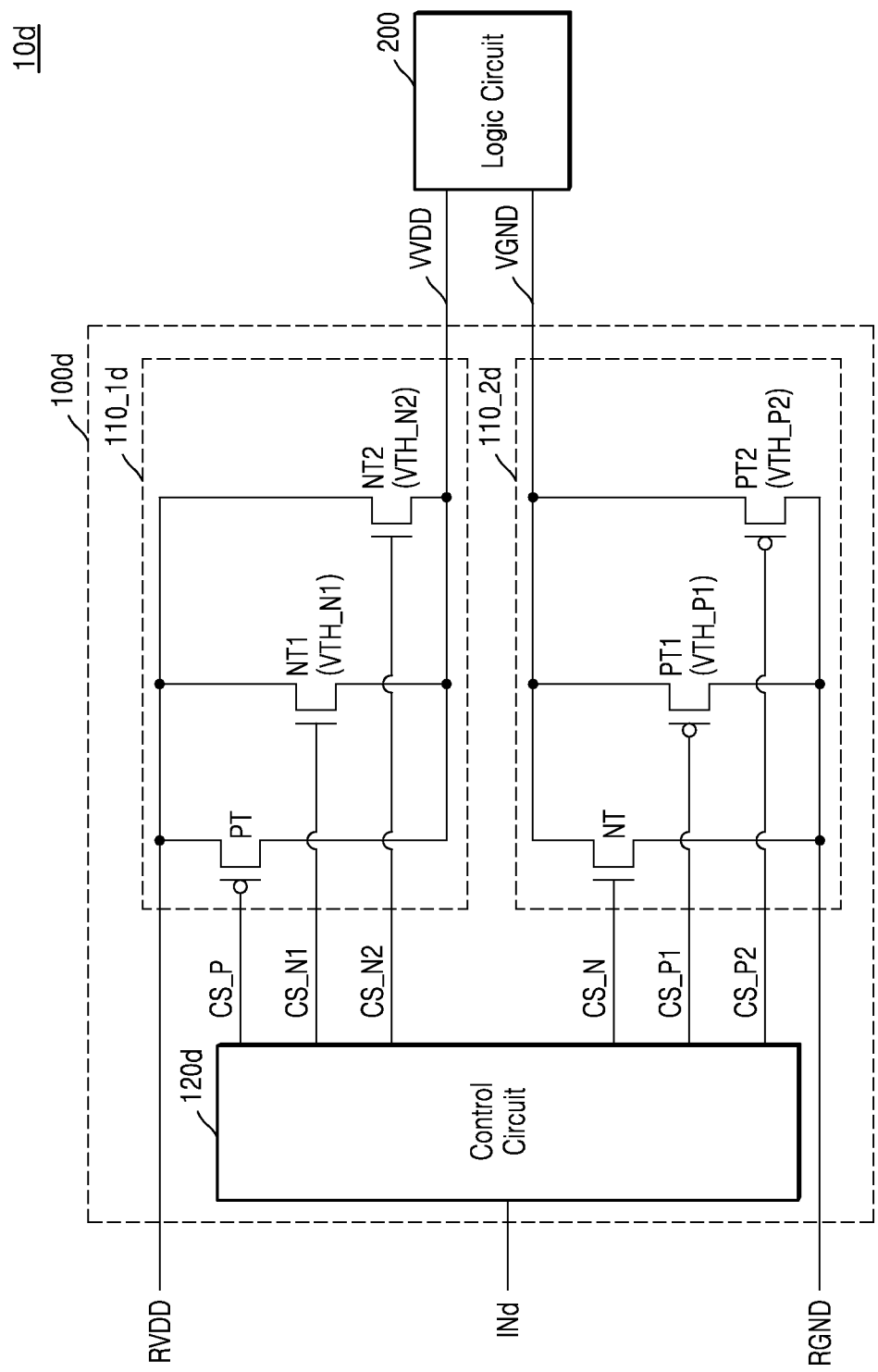
FIG. 9 is a circuit diagram illustrating an integrated circuit including a power gating circuit according to an exemplary embodiment of the inventive concept.

FIG. 9 is a circuit diagram illustrating an integrated circuit 10d including a power gating circuit 100d according to an exemplary embodiment of the inventive concept.

Referring to FIG. 9, the power gating circuit 100d includes a header transistor unit 110_1d connected between the first power line RVDD and the first virtual power line VVDD, a footer transistor unit 110_2d connected between the second power line RGND and the second virtual power line VGND, and a control circuit 120d for providing the switching signals CS_P, CS_N1, CS_N2, CS_N, CS_P_1, and CS_P2 to the header transistor unit 110_1d and the footer transistor unit 110_2d. The control circuit 120d may generate first to third header switching signals CS_P, CS_N1, CS_N2, CS_N, CS_P1, and CS_P2 in response to the control signal INd. Unlike that illustrated in FIG. 9, in an alternate embodiment, the power gating circuit 100d does not include the control circuit 120d.

The header transistor unit 110_1d includes the p-type transistor PT, the first n-type transistor NT1, and the second n-type transistor NT2 connected between the first power line RVDD and the first virtual power line VVDD in parallel. According to an exemplary embodiment, the p-type transistor PT, the first n-type transistor NT1, and the second n-type transistor NT2 may be illustrated as equivalent transistors connected in parallel. Description of the header transistor unit 110 of FIG. 2 may be applied to the header transistor unit 110_1d.

The footer transistor unit 110_2d includes the n-type transistor NT, the first p-type transistor PT1, and the second p-type transistor PT2 connected between the second power line RGND and the second virtual power line VGND in parallel. According to an exemplary embodiment, the n-type transistor NT, the first p-type transistor PT1, and the second p-type transistor PT2 may be illustrated as equivalent transistors connected in parallel. Description of the transistor unit 110c of FIG. 7 may be applied to the footer transistor unit 110_2d.

The control circuit 120d may selectively turn on the transistors included in the header transistor unit 110_1d and the footer transistor unit 110_2d in response to the control signal INd. The control circuit 120d may generate the first header switching signal CS_P for switching the p-type transistor PT, the second header switching signal CS_N1 for switching the first n-type transistor NT1, and the third header switching signal CS_N2 for switching the second n-type transistor NT2. For example, the control circuit 120*d* applies the first header switching signal CS_P to a gate electrode of the p-type transistor PT, the second header switching signal CS_N1 to a gate electrode of the first n-type transistor NT1, and the third header switching signal CS_N2 to a gate electrode of the second n-type transistor NT2. In addition, the control circuit 120*d* may generate a first footer switching signal CS_N for switching the n-type transistor NT, a second footer switching signal CS_P1 for switching the first p-type transistor PT1, and a third footer switching signal CS_P2 for switching the second p-type transistor PT2 in response to the control signal IN*d*. For example, the control circuit 120*d* applies the first footer switching signal CS_N to a gate terminal of the n-type transistor NT, a second footer switching signal CS_P1 to a gate terminal of the first p-type transistor PT1, and a third footer switching signal CS_P2 to a gate terminal of the second p-type transistor PT2.

In accordance with operations of the header transistor unit 110_1*d* and the footer transistor unit 110_2*d*, the first driving voltage of the first virtual power line VVDD electrically connected to the logic circuit 200, the second driving voltage of the second virtual power line VGND electrically connected to the logic circuit 200, and the power mode of the logic circuit 200 may vary. For example, the logic circuit 200 may operate in one of the power-on mode, the plurality of retention modes, and the power-off mode.

In the power-on mode, the control circuit 120*d* generates switching signals CS_P, CS_N1, CS_N2, CS_N, CS_P_1, and CS_P2 for turning on the p-type transistor PT of the header transistor unit 110_1*d* and the n-type transistor NT of the footer transistor unit 110_2*d*. A current flows through the p-type transistor PT of the header transistor unit 110_1*d* and the n-type transistor NT of the footer transistor unit 110_2*d* so that a voltage level of the first virtual power line VVDD may be the same as a level of the power supply voltage VDD of the first power line RVDD and the second voltage of the second virtual power line VGND may be the same as the ground voltage GND of the second power line RGND.

In a plurality of retention modes, the control circuit 120*d* may generate switching signals CS_P, CS_N1, CS_N2, CS_N, CS_P1, and CS_P2 for turning on one of the first n-type transistor NT1 and the second n-type transistor NT2 of the header transistor unit 110_1*d* or one of the first p-type transistor PT1 and the second p-type transistor PT2 of the footer transistor unit 110_2*d*. In the plurality of retention modes, a first high retention voltage (for example, VR1 of FIG. 3D) or a second high retention voltage (for example, VR2 of FIG. 3C) may be applied to the first virtual power line VVDD or the first low retention voltage or the second low retention voltage may be applied to the second virtual power line VGND.

According to an exemplary embodiment, a magnitude of the first threshold voltage VTH_N1 of the first n-type transistor NT1, a magnitude of the second threshold voltage VTH_N2 of the second n-type transistor NT2, a magnitude of the first threshold voltage VTH_P1 of the first p-type transistor PT1, and a magnitude of the second threshold voltage VTH_P2 of the second p-type transistor PT2 are different from each other. In such a case, the power gating circuit 100*d* may drive the logic circuit 200 in one of eight different retention modes.

In the power-off mode, the control circuit 120*d* generates switching signals CS_P, CS_N1, CS_N2, CS_N, CS_P1, and CS_P2 for turning off at least one of the header transistor unit 110_1*d* and the footer transistor unit 110_2*d*. By turning off at least one of the header transistor unit 110_1*d* and the footer transistor unit 110_2*d*, the first virtual power line VVDD or the second virtual power line VGND may be floated. Therefore, power may be blocked from the logic circuit 200.

In FIG. 9, it is illustrated that the header transistor unit 110_1*d* includes only the first n-type transistor NT1 and the second n-type transistor NT2 and the footer transistor unit 110_2*d* includes only the first p-type transistor PT1 and the second p-type transistor PT2. However, the power gating circuit 100*d* according to the inventive concept may include various numbers of n-type transistors and p-type transistors having different threshold voltages. Therefore, the power gating circuit 100*d* may provide various retention modes to the logic circuit 200.

Figure 10:
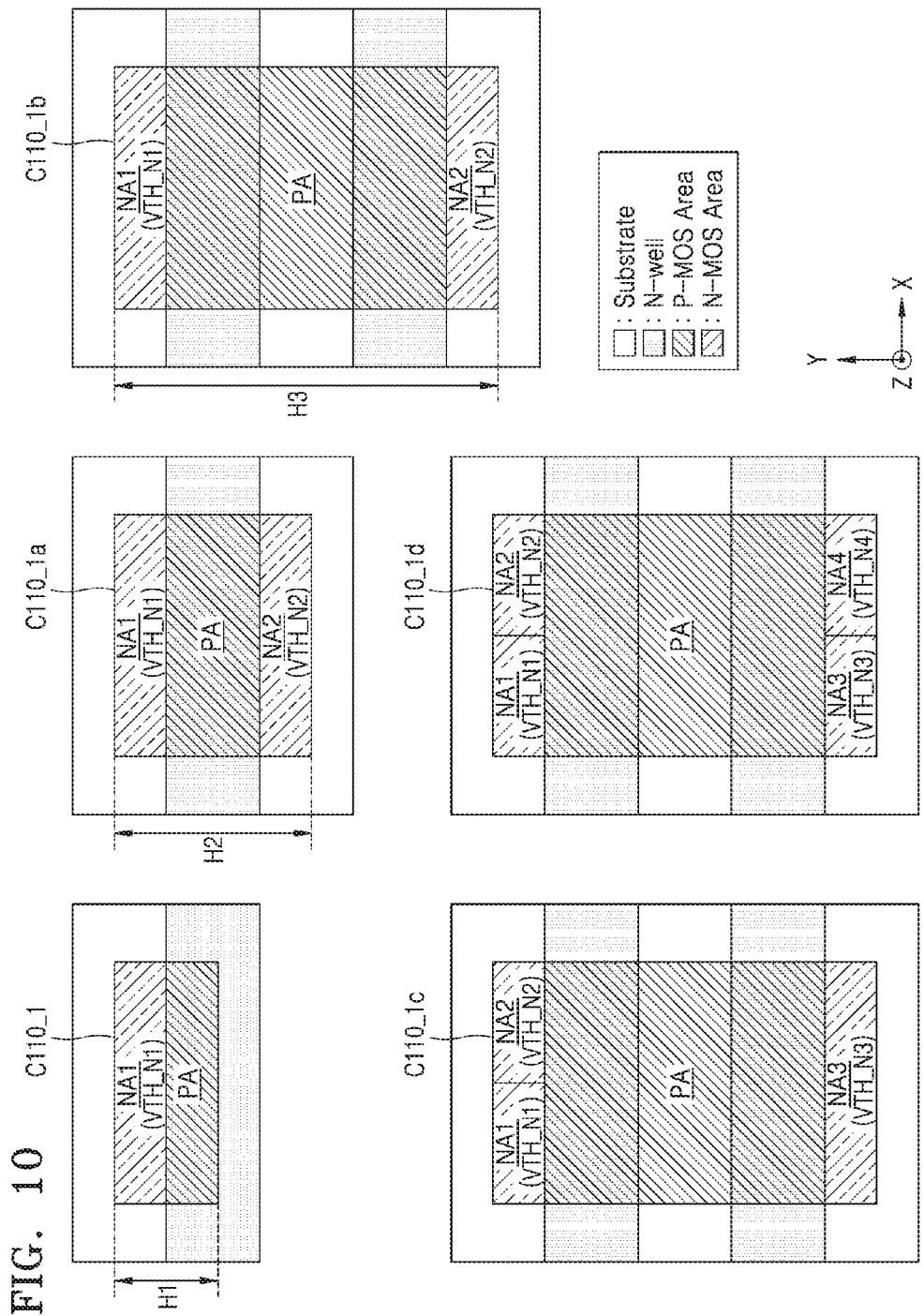
FIG. 10 is a layout diagram illustrating header cells included in a power gating circuit arranged in an integrated circuit according to an exemplary embodiment of the inventive concept.

FIG. 10 is a layout diagram illustrating header cells included in a power gating circuit arranged in an integrated circuit according to an exemplary embodiment of the inventive concept. The layout diagram illustrates a plane having a first direction X and a second direction Y. Components arranged more in a third direction Z than the other components may be referred to as being on the other components and components arranged more in a direction opposite to the third direction Z than the other components may be referred to as being under the other components.

Referring to FIG. 10, first to fifth header cells C110_1 and C110_1*a* to C110_1*d* may extend on a substrate in the first direction X and may include an n-well doped with n-type impurities and the substrate may be doped with p-type impurities. Therefore, first to fourth NMOS areas NA1 to NA4 in which n-type transistors are formed may be formed on the substrate and a PMOS area PA in which p-type transistors are formed may be formed in the n-well. A header transistor unit of a power gating circuit may be formed in each of the first to fifth header cells C110_1 and C110_1*a* to C110_1*d*.

In an exemplary embodiment, each of the first to fourth NMOS areas NA1 to NA4 and the PMOS area PA includes a fin that extends in the first direction X. Alternatively, according to an exemplary embodiment, each of the first to fourth NMOS areas NA1 to NA4 and the PMOS area PA include a nano-sheet that extends in the first direction X.

Each of the first to fifth header cells C110_1 and C110_1*a* to C110_1*d* may be electrically connected to a logic cell and may provide power to the logic cell. The logic cell may be implemented by various kinds of circuits, for example, at least one of the inverter, the NAND gate, the AND gate, the NOR gate, the OR gate, the XOR gate, the XNOR gate, the multiplexer, the adder, the latch, and the flip-flop.

Each of the first to fifth header cells C110_1 and C110_1*a* to C110_1*d* may be electrically connected to the first power line (for example, RVDD of FIG. 1) and the first virtual power line (for example, VVDD of FIG. 1). Each of the first to fifth header cells C110_1 and C110_1*a* to C110_1*d* may have an input pin and an output pin. According to an exemplary embodiment, the input pin of each of the first to fifth header cells C110_1 and C110_1*a* to C110_1*d* may be electrically connected to a gate electrode of a transistor formed in each of the first to fifth header cells C110_1 and C110_1*a* to C110_1*d* and switching signals provided by the control circuit may be input to the input pin of each of the first to fifth header cells C110_1 and C110_1*a* to C110_1*d*. The output pin of each of the first to fifth header cells C110_1 and C110_1a to C110_1d may be electrically connected to the first virtual power line VVDD.

The first header cell C110_1 includes a first NMOS area NA1 in which the n-type transistors having the first threshold voltage VTH_N1 are formed and a PMOS area PA in which the p-type transistors are formed. The first header cell C110_1 may have a first height H1 defined in the second direction Y.

The second header cell C110_1a includes the first NMOS area NA1 in which the n-type transistors having the first threshold voltage VTH_N1 are formed, a second NMOS area NA2 in which the n-type transistors having the second threshold voltage VTH_N2 are formed, and the PMOS area PA in which the p-type transistors are formed. The second header cell C110_1a may have a second height H2 defined in the second direction Y.

The PMOS area PA of the second header cell C110_1a is arranged between the first NMOS area NA1 and the second NMOS area NA2. For example, in the second header cell C110_1a, the second NMOS area NA2, the PMOS area PA, and the first NMOS area NA1 may be arranged in parallel in the second direction Y.

According to an exemplary embodiment, the first threshold voltage VTH_N1 and the second threshold voltage VTH_N2 are different from each other. Therefore, the second header cell C110_1a may provide high retention voltages more various than those of the first header cell C110_1 to the logic cell electrically connected to the second header cell C110_1a. In an exemplary embodiment, the second height H2 is greater than the first height H1. In an exemplary embodiment, the number of p-type transistors formed in the PMOS area PA of the first header cell C110_1 is greater than the number of p-type transistors formed in the PMOS area PA of the second header cell C110_1a, and the power supply voltage (for example, VDD of FIG. 1) may be stably provided to the logic circuit in the power-on mode.

The third header cell C110_1b includes the first NMOS area NA1 in which the n-type transistors having the first threshold voltage VTH_N1 are formed, the second NMOS area NA2 in which the n-type transistors having the second threshold voltage VTH_N2 are formed, and the PMOS transistor PA in which the p-type transistors are formed. In an exemplary embodiment, the PMOS area PA of the third header cell C110_1b is arranged between the first NMOS area NA1 and the second NMOS area NA2. For example, in the third header cell C110_1b, the second NMOS area NA2, the PMOS area PA, and the first NMOS area NA1 may be arranged in parallel in the second direction Y.

The third header cell C110_1b may have a third height H3 defined in the second direction Y. In an exemplary embodiment, the PMOS area PA of the third header cell C110_1b is wider than the PMOS area PA of the second header cell C110_1a and the third height H3 is greater than the second height H2. Therefore, the number of p-type transistors formed in the PMOS area PA of the third header cell C110_1b may be greater than the number of p-type transistors formed in the PMOS area PA of the second header cell C110_1a and the power supply voltage (for example, VDD of FIG. 1) may be stably provided to the logic circuit in the power-on mode.

The fourth header cell C110_1c includes the first NMOS area NA1 in which the n-type transistors having the first threshold voltage VTH_N1 are formed, the second NMOS area NA2 in which the n-type transistors having the second threshold voltage VTH_N2 are formed, the third NMOS area NA3 in which the n-type transistors having the third threshold voltage VTH_N3 are formed, and the PMOS area PA in which the p-type transistors are formed. According to an exemplary embodiment, the first threshold voltage VTH_N1, the second threshold voltage VTH_N2, and the third threshold voltage VTH_N3 are different from each other. Therefore, the fourth header cell C110_1c may provide high retention voltages more various than those of the first to third header cells C110_1, C110_1a, and C110_1b to the logic cell.

The first NMOS area NA1 and the second NMOS area NA2 may be arranged to be adjacent to the PMOS area PA of the fourth header cell C110_1c in the second direction Y and the third NMOS area NA3 may be arranged to be adjacent to the PMOS area PA of the fourth header cell C110_1c in a direction reverse to the second direction Y. According to an exemplary embodiment, the third NMOS area NA3 is wider than the first NMOS area NA1 and the second NMOS area NA2, and the number of n-type transistors formed in the third NMOS area NA3 may be greater than the number of n-type transistors formed in the first NMOS area NA1 and may be greater than the number of n-type transistors formed in the second NMOS area NA2. For example, in the third NMOS area NA3, n-type transistors for providing a specific retention mode with a high use frequency may be formed and, in the specific retention mode, a voltage obtained by subtracting the third threshold voltage VTH_N3 from the power supply voltage may be provided to the logic cell electrically connected to the fourth header cell C110_1c.

The fifth header cell C110_1d includes the first NMOS area NA1 in which the n-type transistors having the first threshold voltage VTH_N1 are formed, the second NMOS area NA2 in which the n-type transistors having the second threshold voltage VTH_N2 are formed, the third NMOS area NA3 in which the n-type transistors having the third threshold voltage VTH_N3 are formed, a fourth NMOS area NA4 in which the n-type transistors having a fourth threshold voltage VTH_N4 are formed, and the PMOS area PA in which the p-type transistors are formed. According to an exemplary embodiment, the first to fourth threshold voltages VTH_N1 to VTH_N4 are different from each other. Therefore, the fifth header cell C110_1d may provide high retention voltages more various than those of the first to fourth header cells C110_1 and C110_1a to C110_1c to the logic cell.

The first NMOS area NA1 and the second NMOS area NA2 may be arranged to be adjacent to the PMOS area PA of the fifth header cell C110_1d in the second direction Y and the third NMOS area NA3 and the fourth NMOS area NA4 may be arranged to be adjacent to the PMOS area PA of the fifth header cell C110_1d in the direction reverse to the second direction Y.

The second header cell C110_1a and the third header cell C110_1b may correspond to the header transistor unit 110 of FIG. 2 and the fourth header cell C110_1c may correspond to the header transistor unit 110a of FIG. 4A. Alternatively, the fourth header cell C110_1c and the fifth header cell C110_1d may correspond to the header transistor unit 120b of FIG. 5. The power gating circuit including the header transistor unit is implemented by the first to fifth header cells C110_1 and C110_1a to C110_1d illustrated in FIG. 10. A power gating circuit according to the inventive concept is not limited thereto and may be implemented by header cells having various structures.

Figure 11:
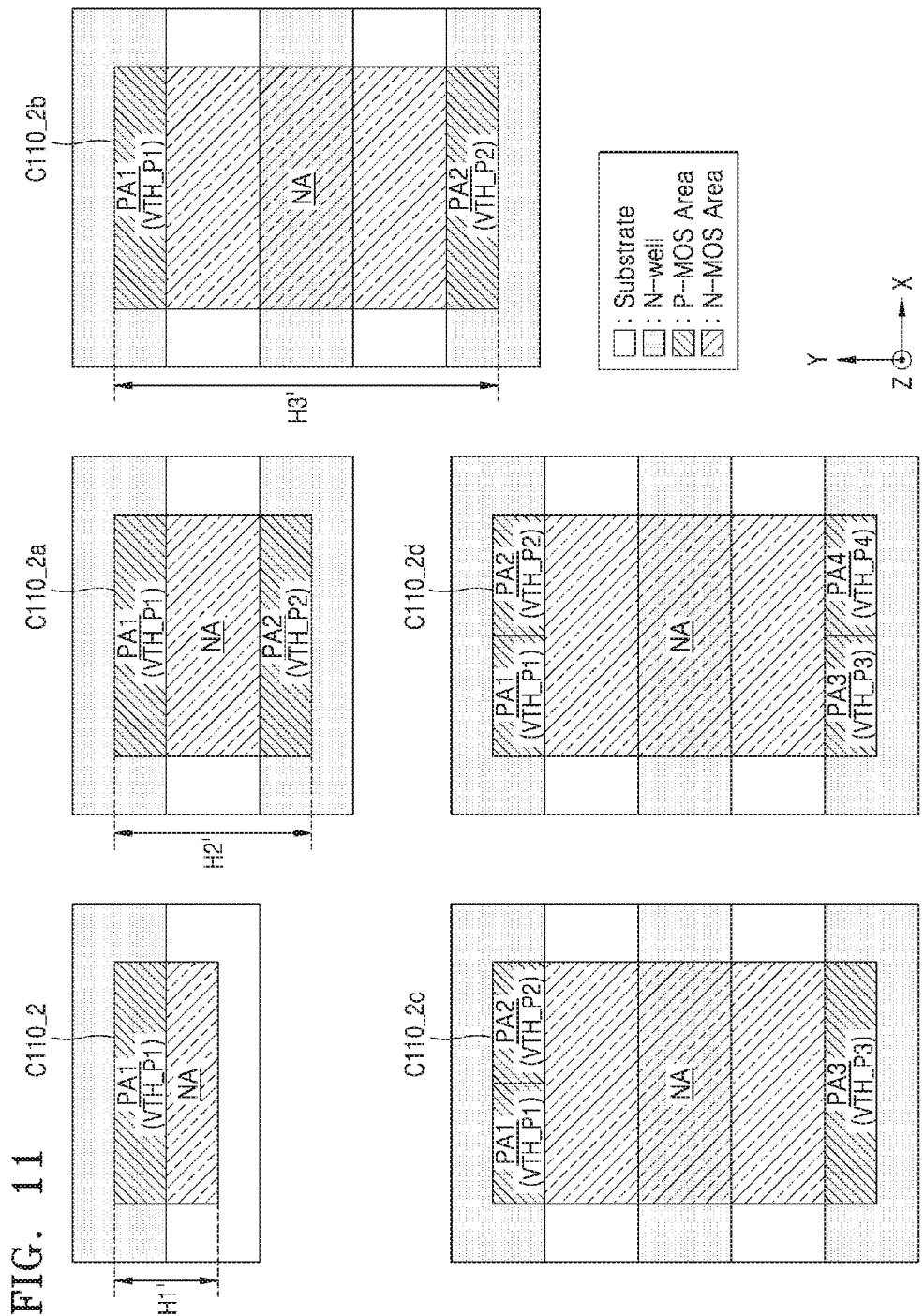
FIG. 11 is a layout diagram illustrating footer cells included in a power gating cell arranged in an integrated circuit according to an exemplary embodiment of the inventive concept.

FIG. 11 is a layout diagram illustrating footer cells included in a power gating cell arranged in an integrated circuit according to an exemplary embodiment of the inventive concept.

Referring to FIG. 11, each of first to fifth footer cells C110_2 and C110_2a to C110_2d may include an n-well extending on a substrate in the first direction X and doped with n-type impurities and the substrate may be doped with p-type impurities. Therefore, on the substrate, an NMOS area NA in which n-type transistors may be formed and, in the n-well, PMOS areas PA1 to PA4 in which p-type transistors may be formed. A footer transistor unit of a power gating circuit may be formed in each of the first to fifth footer cells C110_2 and C110_2a to C110_2d.

Each of the first to fifth footer cells C110_2 and C110_2a to C110_2d may be electrically connected to the second power line (for example, RGND of FIG. 6) and the second virtual power line VGND. Each of the first to fifth footer cells C110_2 and C110_2a to C110_2d may have an input pin and an output pin. According to an exemplary embodiment, the input pin of each of the first to fifth footer cells C110_2 and C110_2a to C110_2d is electrically connected to a gate electrode of a transistor formed in each of the first to fifth footer cells C110_2 and C110_2a to C110_2d and switching signals provided by the control circuit may be input to the input pin of each of the first to fifth footer cells C110_2 and C110_2a to C110_2d. The output pin of each of the first to fifth footer cells C110_2 and C110_2a to C110_2d may be electrically connected to the second virtual power line VGND.

The first footer cell C110_2 includes a first PMOS area PA1 in which p-type transistors having the first threshold voltage VTH_P1 are formed and an NMOS area NA in which n-type transistors are formed. The first footer cell C110_2 may have a first height H1' defined in the second direction Y.

The second footer cell C110_2a includes the first PMOS area PA1 in which p-type transistors having the first threshold voltage VTH_P1 are formed, a second PMOS area PA2 in which p-type transistors having the second threshold voltage VTH_P2 are formed, and an NMOS area NA in which n-type transistors are formed. The second footer cell C110_2a may have a second height H2' defined by the second direction Y.

The NMOS area NA of the second footer cell C110_2a is arranged between the first PMOS area PA1 and the second PMOS area PA2. For example, in the second footer cell C110_2a, the second PMOS area PA2, the NMOS area NA, and the first PMOS area PA1 may be arranged in parallel in the second direction Y.

According to an exemplary embodiment, the first threshold voltage VTH_P1 and the second threshold voltage VTH_P2 are different from each other. Therefore, the second footer cell C110_2a may provide low retention voltages more various than that of the first footer cell C110_2 to a logic cell electrically connected to the second footer cell C110_2a. In an exemplary embodiment, the second height H2' is greater than the first height H1', the number of n transistors formed in the NMOS area NA of the second footer cell C110_2a may be greater than the number of n transistors formed in the NMOS area NA of the first footer cell C110_2. Accordingly, the ground voltage (for example, GND of FIG. 7) may be stably provided to the logic cell in the power-on mode.

The third footer cell C110_2b includes the first PMOS area PA1 in which the p-type transistors having the first threshold voltage VTH_P1 are formed, the second PMOS area PA2 in which the p-type transistors having the second threshold voltage VTH_P2 are formed, and the NMOS area NA in which the n-type transistors are formed. The NMOS area NA of the third footer cell C110_2b is arranged between the first PMOS area PA1 and the second PMOS area PA2. For example, in the third footer cell C110_2b, the second PMOS area PA2, the NMOS area NA, and the first PMOS area PA1 may be arranged in parallel in the second direction Y.

The third footer cell C110_2b may have a third height H3' defined in the second direction Y. In an exemplary embodiment, the NMOS area NA of the third footer cell C110_2b is wider than the NMOS area NA of the second footer cell C110_2a and the third height H3' is greater than the second height H2'. Therefore, the number of n-type transistors formed in the NMOS area NA of the third footer cell C110_2b may be greater than the number of n-type transistors formed in the NMOS area NA of the second footer cell C110_2a and the ground voltage (for example, GND of FIG. 7) may be stably provided to the logic cell in the power-on mode.

The fourth footer cell C110_2c includes the first PMOS area PA1 in which p-type transistors having the first threshold voltage VTH_P1 are formed, the second PMOS area PA2 in which p-type transistors having the second threshold voltage VTH_P2 are formed, a third PMOS area PA3 in which p-type transistors having a third threshold voltage VTH_P3 are formed, and an NMOS area NA in which n-type transistors are formed. According to an exemplary embodiment, the first threshold voltage VTH_P_1, the second threshold voltage VTH_P2, and the third threshold voltage VTH_P3 are different from each other. Therefore, the fourth footer cell C110_2c may provide low retention voltages more various than those of the first to third footer cells C110_2, C110_2a, and C110_2b to the logic cell.

The first PMOS area PA1 and the second PMOS area PA2 may be arranged to be adjacent to the NMOS area NA of the fourth footer cell C110_2c in the second direction Y and the third PMOS area PA3 may be arranged to be adjacent to the NMOS area NA of the fourth footer cell C110_2c in the direction reverse to the second direction Y. According to an exemplary embodiment, the third PMOS area PA3 is wider than the first PMOS area PA1 and the second PMOS area PA2 and the number of p-type transistors formed in the third PMOS area PA3 may be greater than the number of p-type transistors formed in the first PMOS area PA1 and may be greater than the number of p-type transistors formed in the second PMOS area PA2. For example, in the third PMOS area PA3, p-type transistors for providing a specific retention mode with a high use frequency may be formed and, in the specific retention mode, a voltage obtained by subtracting the third threshold voltage VTH_N3 from the power supply voltage may be provided to the logic cell electrically connected to the fourth footer cell C110_2c.

The fifth footer cell C110_2d includes the first PMOS area PA1 in which p-type transistors having the first threshold voltage VTH_P1 are formed, the second PMOS area PA2 in which p-type transistors having the second threshold voltage VTH_P2 are formed, the third PMOS area PA3 in which p-type transistors having the third threshold voltage VTH_P3 are formed, a fourth PMOS area PA4 in which p-type transistors having a fourth threshold voltage VTH_P4 are formed, and an NMOS area NA in which n-type transistors are formed. According to an exemplary embodiment, the first to fourth threshold voltages VTH_P1 to VTH_P4 are different from each other. Therefore, the fifth footer cell C110_2d may provide low retention voltages more various than those of the first to fourth footer cells C110_2 and C110_2a to C110_2c to the logic circuit.

The first PMOS area PA1 and the second PMOS area PA2 may be arranged to be adjacent to the NMOS area NA of the fifth footer cell C110_2*d* and the third PMOS area PA3 and the fourth PMOS area PA4 may be arranged to be adjacent to the NMOS area NA of the fifth footer cell C110_2*d* in the direction reverse to the second direction Y.

The second footer cell C110_2*a* and the third footer cell C110_2*b* may correspond to the footer transistor 110*c* of FIG. 7. The power gating circuit including the footer transistor unit may be implemented by the first to fifth footer cells C110_2 and C110_2*a* to C110_2*d* illustrated in FIG. 11. The power gating circuit according to the inventive concept is not limited thereto and may be implemented by footer cells having various structures.

Figure 12:
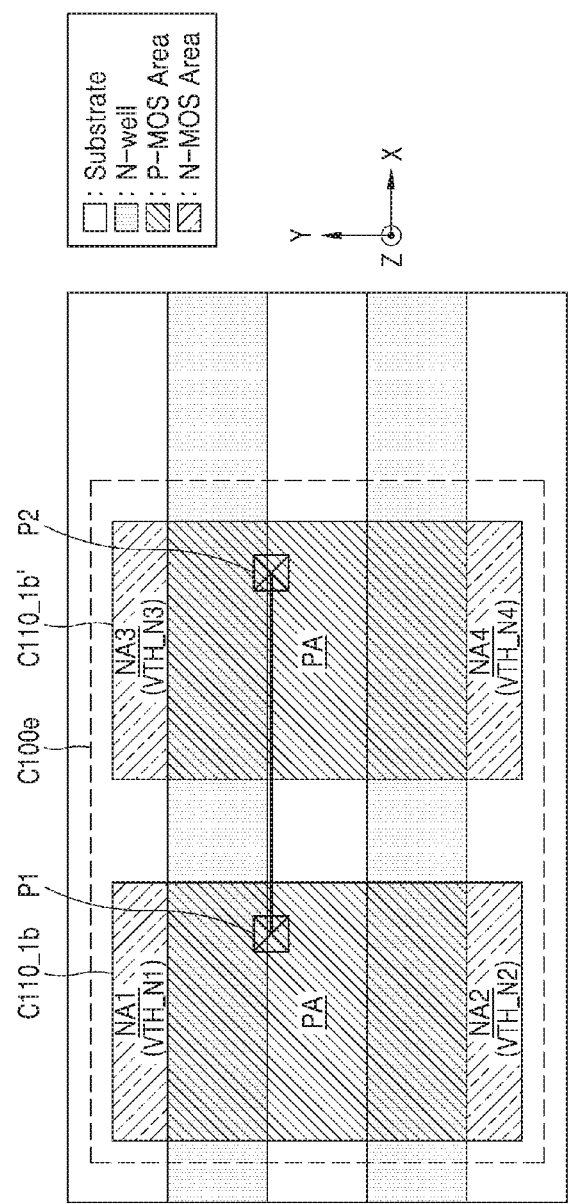
FIG. 12 is a layout diagram illustrating header cells included in a power gating circuit arranged in an integrated circuit according to an exemplary embodiment of the inventive concept.

FIG. 12 is a layout diagram illustrating header cells included in a power gating circuit arranged in an integrated circuit according to an exemplary embodiment of the inventive concept.

Referring to FIG. 12, a header cell group C100*e* includes a first type header cell C110_1*b* and a second type header cell C110_1*b*'. The first type header cell C110_1*b* and the second type header cell C110_1*b*' may be respectively electrically connected to the first power line (for example, RVDD of FIG. 1) and the first virtual power line (for example, VVDD of FIG. 1).

The first type header cell C110_1*b* and the second type header cell C110_1*b*' included in the header cell group C100*e* may include transistors having different threshold voltages. For example, the first type header cell C110_1*b* includes the first NMOS area NA1 in which n-type transistors having the first threshold voltage VTH_N1 are formed, the second NMOS area NA2 in which n-type transistors having the second threshold voltage VTH_N2 are formed, and a PMOS area PA in which p-type transistors are formed. In addition, for example, the second type header cell C110_1*b*' includes a third NMOS area NA3 in which n-type transistors having the third threshold voltage VTH_N3 are formed, a fourth NMOS area NA4 in which n-type transistors having the fourth threshold voltage VTH_N4 are formed, and a PMOS area PA in which p-type transistors are formed. According to an exemplary embodiment, the first to fourth threshold voltages VTH_N1 to VTH_N4 are different from each other. However, the inventive concept is not limited thereto and some of the first to fourth threshold voltages VTH_N1 to VTH_N4 may be the same.

In FIG. 12, it is illustrated that each of the first type header cell C110_1*b* and the second type header cell C110_1*b*' has the same shape as that of the third header cell C110_1*b*. However, the header cell group C100*e* according to the inventive concept is not limited thereto. The header cell group C100*e* may include at least one of the first to fifth header cells C110_1 and C110_1*a* to C110_1*d* of FIG. 10.

According to an exemplary embodiment, the first type header cell C110_1*b* and the second type header cell C110_1*b*' included in the header cell group C100*e* may be arranged in parallel in the first direction X. However, the inventive concept is not limited thereto. According to an exemplary embodiment, heights of the first type header cell C110_1*b* and the second type header cell C110_1*b*' included in the header cell group C100*e* are the same. However, the inventive concept is not limited thereto.

A first output pin P1 of the first type header cell C110_1*b* and a second output pin P2 of the second type header cell C110_1*b*' included in the header cell group C100*e* are electrically connected to each other and the first output pin P1 and the second output pin P2 may be electrically connected to the first virtual power line (for example, VVDD of FIG. 1). The header cell group C100*e* may operate as a header cell. For example, the header cell group C100*e* may operate like the fifth header cell C110_1*d* of FIG. 10.

When the number of n-type transistors included in one header cell increases, a size of the header cell may gradually increase and, as a ratio of the p-type transistors to the n-type transistors is gradually reduced in one header standard cell, resistance may increase in the power-on mode. Therefore, when the header transistor unit of the power gating circuit is implemented by the header cell group C100*e*, in comparison with a case in which the header transistor unit is implemented by the fifth header cell C110_1*d*, it is possible to prevent the ratio of the p-type transistors to the n-type transistors from being reduced and to predict an operation characteristic of the header cell group C100*e*.

In order to arrange the header cell group C100*e* in the integrated circuit, the first type header cell C110_1*b* and the second type header cell C110_1*b*' are arranged and the output pin of the first type header cell C110_1*b* may be electrically connected to the output pin of the second type header cell C110_1*b*'. When the header transistor unit is implemented by the power gating circuit of the fifth header cell C110_1*d* of FIG. 10, in comparison with a case in which the header transistor unit is implemented by the header cell group C100*e*, routing may be easily performed, and in the integrated circuit, an area in which the header transistor unit is formed may be reduced.

In FIG. 12, an embodiment in which different types of header cells form one header cell group is illustrated. However, different types of footer cells may form one footer cell group. Output pins of the footer cells included in the footer cell group may be electrically connected to each other. For example, the integrated circuit may include a first type of footer cell and a second type of footer cell electrically connected to the second power line RGND and the second virtual power line VGND. The first type of footer cell may include the first PMOS area (PA1 of FIG. 11) in which the first p-type transistors having the first threshold voltage (VTH_P1 of FIG. 11) are formed and the second PMOS area (PA2 of FIG. 11) in which the second p-type transistors having the second threshold voltage (VTH_P2 of FIG. 11) are formed. The second type of footer cell may include the third PMOS area in which the third p-type transistors having the third threshold voltage (VTH_P3 of FIG. 11) are formed and the fourth PMOS area in which the fourth p-type transistors having the fourth threshold voltage (VTH_P4) are formed. According to an exemplary embodiment, the first type of footer cell and the second type of footer cell may be arranged in parallel in the first direction X and the output pin of the first type footer cell may be electrically connected to the output pin of the second type footer cell.

Figure 13:
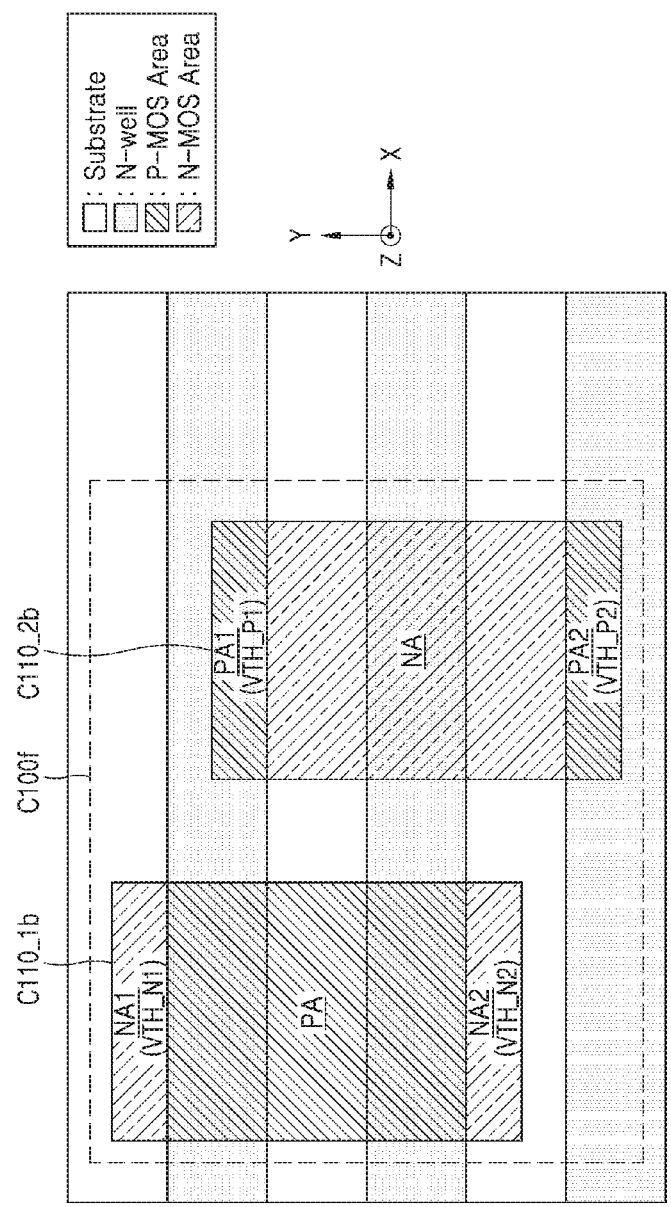
FIG. 13 is a layout diagram illustrating a header cell and a footer cell included in a power gating cell arranged in an integrated circuit according to an exemplary embodiment of the inventive concept.

FIG. 13 is a layout diagram illustrating header cell and footer cell included in a power gating cell arranged in an integrated circuit according to an exemplary embodiment of the inventive concept.

Referring to FIG. 13, a power gating cell group C100*f* may correspond to the header transistor unit 110_1*d* and the footer transistor unit 110_2*d* of FIG. 9. The power gating cell group C100*f* includes a third header cell C110_1*b* and a third footer cell C110_2*b*. The third header cell C110_1*b* may be electrically connected to the first power line (for example, RVDD of FIG. 1) and the first virtual power line (for example, VVDD of FIG. 1). The third footer cell C110_2*b* may be electrically connected to the second power line (for example, RGND of FIG. 1) and the second virtual power line (for example, VGND of FIG. 1). For example, the output pin of the third header cell C110_1*b* may be electrically connected to the first virtual power line VVDD and the output pin of the third footer cell C110_2b may be electrically connected to the second virtual power line VGND.

According to an exemplary embodiment, the third header cell C110_1b and the third footer cell C110_2b included in the power gating cell group C100f are arranged to overlap in the first direction X.

For convenience sake, the power gating group C_100f including the third header cell C110_1b of FIG. 10 and the third footer cell C110_2b of FIG. 11 is illustrated. However, various power gating cell groups including header cells and footer cells having various shapes may form the power gating circuit 100f. For example, one of the first to fifth header cells C110_1 and C110_1a and C110_1d of FIG. 10 and one of the first to fifth footer cells C110_2 and C110_2a to C110_2d of FIG. 11 may form the power gating cell group.

Figure 14:
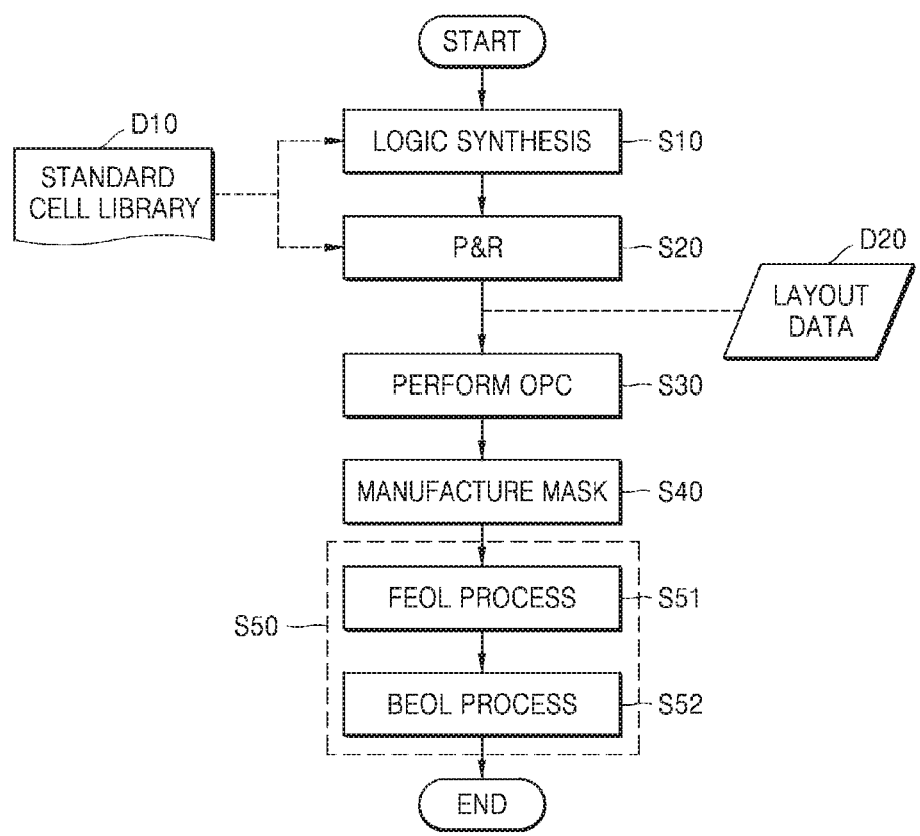
FIG. 14 is a flowchart illustrating a method of manufacturing an integrated circuit according to an exemplary embodiment of the inventive concept.

FIG. 14 is a flowchart illustrating a method of manufacturing an integrated circuit according to an exemplary embodiment of the inventive concept.

Referring to FIG. 14, a standard cell library D10 may include information items on standard cells, for example, function information, characteristic information, and layout information. The standard cell library D10 may include data that defines a layout of a standard cell.

The standard cell library D10 may define layouts of header cells (for example, the first to fifth header cells C110_1 and C110_1a to C110_1d of FIG. 10). The standard cell library D10 may define layouts of footer cells (for example, the first to fifth footer cells C110_2 and C110_2a to C110_2d of FIG. 11). In addition, the standard cell library D10 may define a layout of a header cell group (for example, the header cell group C100e of FIG. 12), a layout of a footer cell group, and a layout of a power gating cell group (for example, the power gating cell group C100f of FIG. 13).

In operation S10, logic synthesis for generating net-list data from register-transfer level (RTL) data may be performed. The net-list data may include a description of the connectivity of an electronic circuit. The net-list data may include a list of electronic components of a circuit and a list of the nodes they are connected to. For example, a semiconductor design tool (for example, a logic synthesis tool) may generate net-list data including a bit-stream or a net-list by performing logic synthesis with reference to the standard cell library D10 from RTL data created as a hardware description language (HDL) such as a VHSIC hardware description language (VHDL) or Verilog.

In operation S20, with reference to the standard cell library D10, a place & routing (P&R) operation of generating layout data D20 from the net-list data is performed. In the P&R operation S20, operations of arranging standard cells, generating interconnections, and generating the layout data D20 may be performed.

For example, the semiconductor design tool (for example, a P&R tool) may arrange a plurality of standard cells from the net-list data with reference to the standard cell library D10. For example, the semiconductor design tool may select one of a plurality of layouts of standard cells defined by the net-list data and may arrange the selected layout of the standard cells with reference to the standard cell library D10.

For example, the semiconductor design tool may select one of the first to fifth header cells C110_1 and C110_1a to C110_1d of FIG. 10 and may arrange the selected header cell as the power gating circuit. For example, the semiconductor design tool may select one of the first to fifth footer cells C110_2 and C110_2a to C110_2d of FIG. 12 and may arrange the selected footer cell as the power gating circuit.

In addition, for example, the semiconductor design tool may arrange the header cell group C100e of FIG. 12 as the power gating circuit and may arrange the power gating cell group C100f of FIG. 13 as the power gating circuit. The semiconductor design tool may arrange a standard cell considering feasibility of prediction of an operation characteristic of the arranged standard cell, a magnitude of resistance in the power-on mode, and feasibility of routing.

Mutual connection may electrically connect an output pin of the standard cell to an input pin thereof. For example, at least one via and at least one routing wiring line may be provided. The layout data D20 may have a format such as GDSII and may include geometric information of standard cells and mutual connections.

In operation S30, optical proximity correction (OPC) is performed. OPC may refer to an operation for forming a pattern of a desired shape by correcting distortion such as refraction caused by a characteristic of light in photolithography included in semiconductor processes for manufacturing the integrated circuit. A pattern on a mask may be determined by applying the OPC to the layout data D20.

In operation S40, an operation of manufacturing a mask is performed. For example, as the OPC is applied to the layout data D20, patterns on a mask may be defined in order to form patterns formed in a plurality of layers and at least one mask (or a photo-mask) for forming the patterns of the plurality of layers may be manufactured.

In operation S50, an operation of manufacturing an integrated circuit is performed. For example, the integrated circuit may be manufactured by patterning a plurality of layers by using at least one mask manufactured in operation S40. According to an exemplary embodiment, operation S50 includes operations S51 and S52.

In operation S51, a front-end-of-line (FEOL) process is performed. In processes of manufacturing the integrated circuit, in the FEOL process, individual elements, for example, a transistor, a capacitor, and a resistor may be formed on a substrate.

In operation S52, a back-end-of-line (BEOL) process is performed. In the processes of manufacturing the integrated circuit, in the BEOL process, the individual elements, for example, the transistor, the capacitor, and the resistor are connected to each other.

Figure 15:
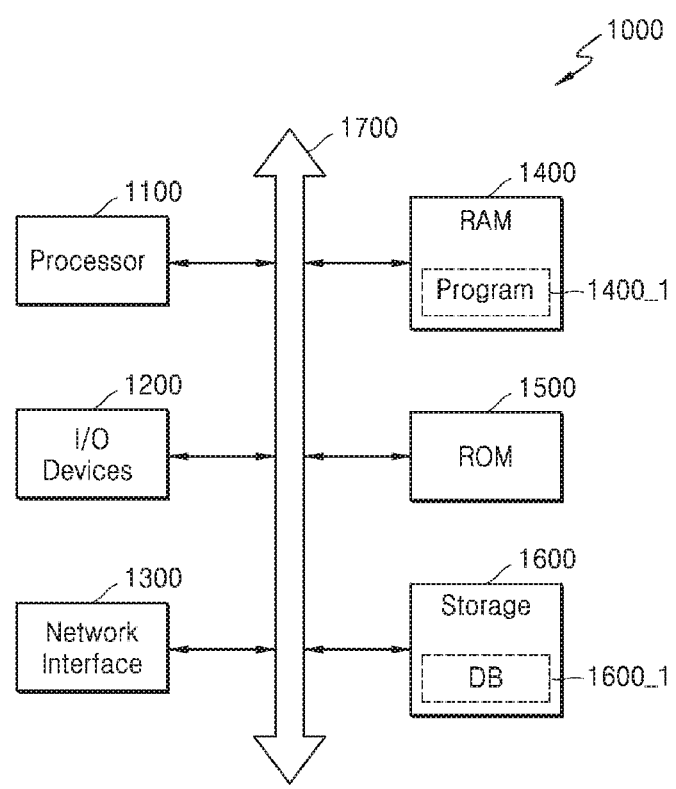
FIG. 15 is a block diagram illustrating a computing system including memory for storing a program according to an exemplary embodiment of the inventive concept.

FIG. 15 is a block diagram illustrating a computing system 1000 including memory for storing a program according to an exemplary embodiment of the inventive concept. At least some of the operations included in a method of manufacturing an integrated circuit (for example, the method of manufacturing the integrated circuit of FIG. 14) according to an exemplary embodiment of the inventive concept may be performed by the computing system 1000.

Referring to FIG. 15, the computing system 1000 may be a fixed computing system such as a desktop computer, a workstation, or a server or a portable computing system such as a laptop computer. The computing system 1000 includes a processor 1100, input and output devices 1200, a network interface 1300, random access memory (RAM) 1400, read only memory (ROM) 1500, and a storage device 1600. The processor 1100, the input and output devices 1200, the network interface 1300, the RAM 1400, the ROM 1500, and the storage device 1600 may communicate with each other through a bus 1700.

The processor 1100 may be referred to as a processing unit and may include at least one core capable of executing an arbitrary instruction set such as a micro-processor, an application processor (AP), a digital signal processor (DSP), or a graphic processing unit (GPU). For example, the processor 1100 may access memory, that is, the RAM 1400 or the ROM 1500 through the bus 1700 and may execute instructions stored in the RAM 1400 or the ROM 1500.

The RAM 1400 may store a program 1400_1 for manufacturing the integrated circuit according to the exemplary embodiment of the inventive concept or at least a part of the program 1400_1. For example, the program 1400_1 may include the semiconductor design tool, for example, a logic synthesis tool and the P&R tool.

The program 1400_1 may perform at least some of operations included in the method of manufacturing the integrated circuit of FIG. 14. That is, the program 1400_1 may include a plurality of instructions that may be executed by the processor 1100 and the plurality of instructions included in the program 1400_1 may let the processor 1100 perform some of operations included in the method of manufacturing the integrated circuit of FIG. 14.

Data stored in the storage 1600 are not lost even though power supplied to the computing system 1000 is blocked. For example, the storage 1600 may include a non-volatile memory device and may include a storage medium such as a magnetic tape, an optical disc, or a magnetic disc. The storage device 1600 may store the program 1400_1 according to the exemplary embodiment of the inventive concept and, before the program 1400_1 is executed by the processor 110, the program 1400_1 or at least a part of the program 1400_1 may be loaded from the storage 1600 device onto the RAM 1400. Alternatively, the storage device 1600 may store a file created by a program language and the program 1400_1 generated by a compiler from the file or at least a part of the program 1400_1 may be loaded onto the RAM 1400.

The storage device 1600 may store a database 1600_1 and the database 1600_1 may include information required for designing the integrated circuit. For example, the database 1600_1 may include the standard cell library D10 of FIG. 14. In addition, the storage device 1600 may store data to be processed by the processor 110 or data processed by the processor 1100.

The input and output devices 1200 may include an input device such as a keyboard or a pointing device and an output device such as a display device or a printer. The network interface 1300 may process access to a network located outside the computing system 1000.

While the inventive concept has been particularly shown and described with reference to embodiments thereof, it will be understood that various changes in form and details may be made therein without departing from the spirit and scope of the disclosure.

What is claimed is:

1. An integrated circuit comprising:
a power gating circuit configured to receive a power supply voltage from a first power line and to output a first driving voltage to a first virtual power line, wherein the power gating circuit comprises a first p-type transistor and a first n-type transistor connected in parallel between the first power line and the first virtual power line, a second n-type transistor connected between the first power line and the first virtual power line, and a control circuit configured to provide switching signals to the transistors in response to a control signal; and
a logic circuit electrically connected to the first virtual power line and configured to receive power from the power gating circuit,
wherein the control circuit is configured to adjust the switching signals to provide the first driving voltage of the power supply voltage during a power-on mode, the first driving voltage of a first retention voltage lower than the power supply voltage and higher than a ground voltage during a first retention mode, and the first driving voltage of a second retention voltage lower than the first retention voltage and higher than the ground voltage during a second retention mode,
wherein a P-type metal-oxide-semiconductor (PMOS) area of the first P-type transistor is arranged between an N-type metal-oxide-semiconductor (NMOS) area of the first N-type transistor and an NMOS area of the second N-type transistor.

2. The integrated circuit of claim 1, wherein the power gating circuit operates in one of the power-on mode, the first retention mode, the second retention mode, and a power-off mode, and wherein the p-type transistor is turned on and the n-type transistors are turned off in the power-on mode, the p-type and second n-type transistors are turned off and the first n-type transistor is turned on in the first retention mode, the p-type and first n-type transistors are turned off and the second n-type transistor is turned on in the second retention mode, and the p-type transistor and the n-type transistors are turned off in the power-off mode.

3. The integrated circuit of claim 1, wherein the power gating circuit operates in one of the power-on mode, the first retention mode and the second retention mode, wherein the power gating circuit outputs the first driving voltage of the power supply voltage in the power-on mode, outputs the first driving voltage of the first retention voltage in the first retention mode, outputs the first driving voltage of the second retention voltage in the second retention mode, wherein the first retention voltage is lower than the power supply voltage by a first threshold voltage of the first n-type transistor, and wherein the second retention voltage is lower than the power supply voltage by a second threshold voltage of the second n-type transistor.

4. The integrated circuit of claim 1, wherein the logic circuit is electrically connected to a second power line to which the ground voltage is applied.

5. The integrated circuit of claim 1, wherein the power gating circuit receives the ground voltage from a second power line and outputs a second driving voltage to a second virtual power line, and wherein the power gating circuit further comprises an n-type transistor and a p-type transistor connected in parallel between the second power line and the second virtual power line.

6. An integrated circuit comprising a first power gating cell configured to receive a power supply voltage from a first power line and to provide a first driving voltage to a logic cell through a first virtual power line, wherein the first power gating cell comprises:
a first P-type metal-oxide-semiconductor (PMOS) area comprising a first p-type transistor connected between the first power line and the first virtual power line;
a first N-type metal-oxide-semiconductor (NMOS) area comprising a first n-type transistor connected between the first power line and the first virtual power line; and
a second NMOS area comprising a second n-type transistor connected between the first power line and the first virtual power line, and
wherein the first PMOS area comprises an n well doped with n-type impurities and extending in a first direction, wherein the first PMOS area is arranged between the first NMOS area and the second NMOS area.

7. The integrated circuit of claim 6, wherein a first threshold voltage of the first n-type transistor is different from a second threshold voltage of the second n-type transistor.

8. The integrated circuit of claim 6, wherein the first power gating cell further comprises a third NMOS area comprising a third n-type transistor connected between the first power line and the first virtual power line, and
wherein the first NMOS area and the third NMOS area are arranged to be adjacent to the first PMOS area in a second direction perpendicular to the first direction and the second NMOS area is arranged to be adjacent to the PMOS area in a direction reverse to the second direction.

9. The integrated circuit of claim 8, wherein the second NMOS area is wider than the first NMOS area.

10. The integrated circuit of claim 6, wherein the integrated circuit further comprises a second power gating cell configured to provide the first driving voltage to the logic cell, and wherein the second power gating cell comprises:
a second PMOS area comprising a second p-type transistor connected between the first power line and the first virtual power line;
a third NMOS area comprising a third n-type transistor connected between the first power line and the first virtual power line; and
a fourth NMOS area comprising a fourth n-type transistor connected between the first power line and the first virtual power line.

11. The integrated circuit of claim 10, wherein a first output pin of the first power gating cell is electrically connected to a second output pin of the second power gating cell.

12. The integrated circuit of claim 6, further comprising a second power gating cell configured to receive a ground voltage from a second power line and to provide a second driving voltage to the logic cell through a second virtual power line, wherein the second power gating cell comprises:
a third NMOS area comprising a third n-type transistor connected between the second power line and the second virtual power line;
a first PMOS area comprising a second p-type transistor connected between the second power line and the second virtual power line is formed; and
a second PMOS area comprising a third p-type transistor connected between the second power line and the second virtual power line.

13. An integrated circuit comprising a first power gating cell for receiving a ground voltage from a ground line and providing a driving voltage to a logic cell through a virtual ground line, wherein the first power gating cell comprises:
a first N-type metal-oxide-semiconductor (NMOS) area comprising a first n-type transistor connected between the ground line and the virtual ground line;
a first P-type metal-oxide-semiconductor (PMOS) area comprising a first p-type transistor connected between the ground line and the virtual ground line is formed; and
a second PMOS area comprising a second p-type transistor connected between the ground line and the virtual ground line, and
wherein the first PMOS area is located in an n well doped with n-type impurities and extending in a first direction,
wherein the first NMOS area is arranged between the first PMOS area and the second PMOS area.

14. The integrated circuit of claim 13, wherein a first threshold voltage of the first p-type transistor is different from a second threshold voltage of the second p-type transistor.

15. The integrated circuit of claim 13, wherein the first power gating cell further comprises a third PMOS area comprising a third p-type transistor connected between the ground line and the virtual ground line, and
wherein the first PMOS area and the third PMOS area arranged to be adjacent to the first NMOS area in a second direction perpendicular to the first direction and the second PMOS area is arranged to be adjacent to the first NMOS area in a direction reverse to the second direction.

16. The integrated circuit of claim 15, wherein the second PMOS area is wider than the first PMOS area.

17. The integrated circuit of claim 13, further comprising a second power gating cell configured to provide the driving voltage to the logic cell, wherein the second power gating cell comprises:
a second NMOS area comprising a second n-type transistor connected between the ground line and the virtual ground line;
a third PMOS area comprising a third p-type transistor connected between the ground line and the virtual ground line; and
a fourth PMOS area comprising a fourth p-type transistor connected between the ground line and the virtual ground line.

* * * * *